(12) United States Patent
Yamashita et al.

(10) Patent No.: US 7,919,974 B2
(45) Date of Patent: Apr. 5, 2011

(54) ELECTRONIC DEVICE TEST APPARATUS AND METHOD OF CONFIGURING ELECTRONIC DEVICE TEST APPARATUS

(75) Inventors: Kazuyuki Yamashita, Tokyo (JP); Yoshiyuki Masuo, Tokyo (JP)

(73) Assignee: Advantest Corporation, Tokyo (JP)

( * ) Notice: Subject to any disclaimer, the term of this patent is extended or adjusted under 35 U.S.C. 154(b) by 845 days.

(21) Appl. No.: 11/570,682

(22) PCT Filed: Jul. 22, 2005

(86) PCT No.: PCT/JP2005/013493
§ 371 (c)(1),
(2), (4) Date: Dec. 15, 2006

(87) PCT Pub. No.: WO2006/009253
PCT Pub. Date: Jan. 26, 2006

(65) Prior Publication Data
US 2008/0042667 A1    Feb. 21, 2008

(30) Foreign Application Priority Data
Jul. 23, 2004    (JP) ................. 2004-215802

(51) Int. Cl.
*G01R 31/28* (2006.01)
*G01R 31/26* (2006.01)
(52) U.S. Cl. ............... 324/757.01; 324/762.01
(58) Field of Classification Search .............. None
See application file for complete search history.

(56) References Cited

U.S. PATENT DOCUMENTS

| | | | |
|---|---|---|---|
| 5,148,100 A * | 9/1992 | Sekiba | 324/765 |
| 6,304,073 B1 | 10/2001 | Saito | |
| 6,396,295 B1 * | 5/2002 | Robinson et al. | 324/765 |
| 6,445,203 B1 | 9/2002 | Yamashita et al. | |
| 6,563,331 B1 * | 5/2003 | Maeng | 324/760 |
| 6,629,282 B1 | 9/2003 | Sugamori et al. | |
| 6,651,204 B1 | 11/2003 | Rajsuman et al. | |
| 6,831,296 B1 * | 12/2004 | Lee et al. | 257/48 |
| 2002/0011836 A1 * | 1/2002 | Ito et al. | 324/158.1 |
| 2004/0046545 A1 * | 3/2004 | Akiyama et al. | 324/158.1 |
| 2004/0077200 A1 * | 4/2004 | Ishikawa et al. | 439/190 |

FOREIGN PATENT DOCUMENTS

| | | |
|---|---|---|
| CN | 1384366 | 12/2002 |
| DE | 10125344 | 3/2002 |
| JP | 1-289133 | 11/1989 |
| JP | 6-120316 | 4/1994 |

(Continued)

OTHER PUBLICATIONS

English Language Abstract of JP 2003-215201.
English Language Abstract of JP 9-197000.
U.S. Appl. No. 11/571,428 to Ito et al., which was filed on Dec. 29, 2006.
U.S. Appl. No. 11/444,425 to Mineo et al., which was filed on Jun. 1, 2006.

(Continued)

*Primary Examiner* — Ha Tran T Nguyen
*Assistant Examiner* — Roberto Velez
(74) *Attorney, Agent, or Firm* — Greenblum & Bernstein P.L.C.

(57) ABSTRACT

A handler is configured by, separably and connectably, a plurality of types of handling modules of different throughputs and a plurality of types of test modules of different numbers of simultaneous measurements and/or test temperatures. Based on the maximum number of measurable pins of the tester outputting a test pattern and examining a response pattern, the number of terminals of the DUTs, and the test time, the throughput of the handling module and the number of simultaneous measurements and/or test temperature of the test module are selected and combined.

7 Claims, 26 Drawing Sheets

FOREIGN PATENT DOCUMENTS

| | | |
|---|---|---|
| JP | 6-342836 | 12/1994 |
| JP | 7-225255 | 8/1995 |
| JP | 9-89984 | 4/1997 |
| JP | 9-197000 | 7/1997 |
| JP | 11-23659 | 1/1999 |
| JP | 11-26538 | 1/1999 |
| JP | 2001-177526 | 6/2001 |
| JP | 2003-215201 | 7/2003 |
| JP | 2003-329741 | 11/2003 |
| WO | 2004/008487 | 1/2004 |

OTHER PUBLICATIONS

U.S. Appl. No. 10/599,374 to Kiyokawa et al., which was filed on Sep. 27, 2006.

U.S. Appl. No. 11/610,043 to Mizushima et al., which was filed on Dec. 13, 2006.

English language Abstract of CN 1384366, Dec. 11, 2002.

English language Abstract of DE 10125344, Mar. 7, 2002.

* cited by examiner

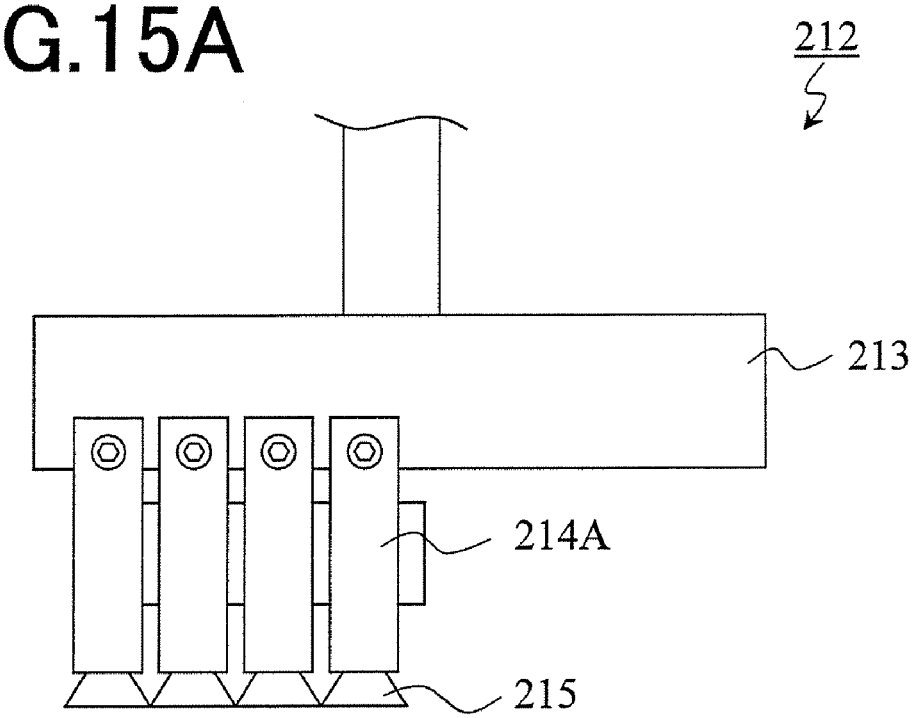

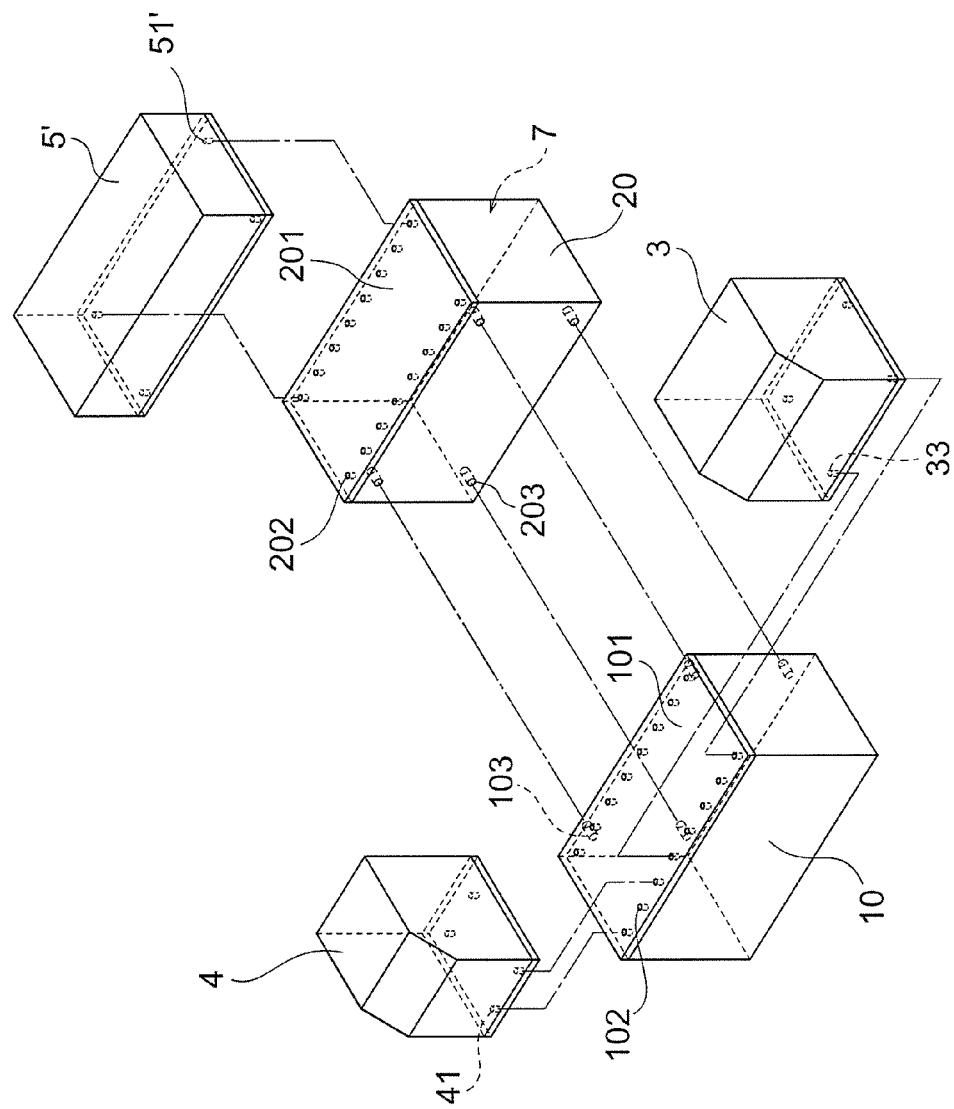

ELECTRONIC DEVICE TEST APPARATUS AND METHOD OF CONFIGURING ELECTRONIC DEVICE TEST APPARATUS

BACKGROUND OF THE INVENTION

1. Field of the Invention

The present invention relates to an electronic device test apparatus for testing semiconductor integrated circuit devices and various other electronic devices and a method of configuring an electronic device test apparatus, more particularly relates to an electronic device test apparatus enabling optimization so that the efficiency of the test apparatus as a whole does not fall due to the performance of a handler even when maximum number of simultaneous measurements has been changed due to the relationship between the maximum number of testable pins of the tester and the number of pins of an electronic device under test (DUT) and a method of configuring such an electronic device test apparatus.

2. Description of the Related Art

In the process of production of semiconductor devices, an electronic device test apparatus becomes necessary for testing the finally produced IC chip or other electronic device. This type of electronic device is tested by setting the test environment to an ordinary temperature, high temperature, or low temperature environment, inputting a test pattern to the IC chip and operating it in that temperature state, and examining the response pattern. This is because the characteristics of an IC chip have to be guaranteed to enable good operation both under ordinary temperature or a high temperature or low temperature.

A general electronic device test apparatus of the related art is comprised of a test head provided with a tester in which a program for transmitting a test pattern and examining the response pattern is stored and contact terminals for electrically connecting this tester and a DUT and a handler for successively conveying a large number of DUTs to the contact terminals of the test head and physically classifying the DUTs finished being tested in accordance with the test results. Further, it sets DUTs at the handler for conveyance to the test head where it presses the DUTs against the contact terminals of the test head for electrical contact for the purpose of the desired operating test.

One of the aspects of the performance of a tester is the maximum number of testable pins. This means the number of signal terminals enabling output from and input to that tester. The maximum number of devices able to be simultaneously tested is determined from the relationship of this maximum number of testable pins and the number of pins (number of terminals) of the DUT. For example, when the maximum number of testable pins of the tester is 100 and the number of terminals of the DUT is 20, the maximum number of simultaneous measurements is 100÷20=5.

On the other hand, one of the aspects of the performance of a handler is its throughput. This is the number of the DUTs which that handler can handle per unit time. That is, this shows the mechanical operation speed by which the handler sets the pre-tested DUTs, aligns them before the test head, conveys them to the test head, pushes them against the contact terminals, then arranges them classified in accordance with the test results. The larger the throughput, the higher the productivity of the handler. However, even with a handler with a large throughput, if the time for pressing the DUTs against the contact terminals for transfer of operating signals (hereinafter also referred to as the "test time") is long, so-called "waiting time" will occur in the conveyance system, so the maximum throughput will not necessarily be realized.

That is, depending on the test time, the maximum throughput will sometimes be realized and other times will not. On the other hand, there is the difficulty that the higher the speed of the conveyance system, the greater the cost of the equipment.

As explained above, in an electronic device test apparatus, if the numbers of terminals of the DUTs (numbers of pins) differ, the maximum number of simultaneous measurements will also change. Therefore, to obtain the desired productivity, testers with different maximum numbers of measurable pins would become necessary. If using common equipment for the testers, handlers of specifications with different throughputs become necessary. However, if not selecting the handler with the optimum throughput from the relationship with the test time, the result will not be efficient. Further, due to the target test temperature (low temperature, ordinary temperature, or high temperature) or testable temperature range, adiabatic structures or thermostats (chambers) with different components or temperature regulators become necessary.

Further, electronic device test apparatuses come in shapes or IC pin configurations differing depending on the types of the DUTs. Switching change kits enables conveyance by common test trays.

Further, at the tester side with the test heads, there are testers of a plurality of types of system configurations designed for diverse DUTs. Therefore, the maximum number of testable pins (number of channels of tester) provided at the test head differs tremendously such as for example 256, 512, 1024, and other channels.

SUMMARY OF THE INVENTION

An object of the present invention is to provide an electronic device test apparatus enabling configuration and change of the optimum system configuration so that the efficiency of the test apparatus as a whole does not fall due to the performance of a handler even when maximum number of simultaneous measurements has been changed due to the relationship between the maximum number of testable pins of the tester and the number of pins of an electronic device under test (DUT) and a method of configuring such an electronic device test apparatus.

To achieve the above object, according to a first aspect of the present invention, there is provided an electronic device test apparatus bringing DUTs into electrical contact with contacts of a test head, where at least one of the units forming the electronic device test apparatus is modularized to enable exchange, add or reconfigure (reorganize).

Preferably, the units forming the electronic device test apparatus include at least one of a stocker unit for storing DUTs before and after testing, a loader unit for unloading the DUTs, a soak unit for making the DUTs a target temperature, a contact unit for bringing the DUTs into electrical contact with contacts, an eject unit for temporarily holding DUTs finished being tested at the contact unit, and an unloader unit for classifying DUTs finished being tested at the contact unit in accordance with test results, and at least one unit among the units is modularized to enable exchange, add or reconfigure.

In the above invention, at least one unit among the units is modularized to enable exchange, add or reconfigure, or a combined unit of two or more units among the units are modularized to enable exchange, add or reconfigure.

Preferably, the units forming the electronic device test apparatus include a handling unit and a test unit, the handling unit stores DUTs before and after testing, takes out stored DUTs to unload them to the test unit, and classifies the DUTs finished being tested at the test unit in accordance with the test results, the test unit makes the DUTs loaded from the handling unit the target temperature and brings the DUTs into electrical contact with the contacts of the test head from which a test pattern is output and a response pattern is input, and at least one of the handling unit or the test unit is modularized to enable exchange, add or reconfigure .

Preferably, the handling unit has a stocker unit for storing DUTs before and after testing, a loader unit for unloading DUTs stored in the stocker unit to the test unit, and an unloader unit for classifying DUTs finished being tested at the test unit in accordance with test results.

Preferably, at lease one unit among the stocker unit, the loader unit, or the unloader unit have controllers for controlling the units individually (separately) or in common, and the apparatus further has a central managing means for centrally managing the controllers.

Preferably, the test unit has a soak unit for making the DUTs loaded from the handling unit a target temperature, a contact unit for bringing the DUTs into electrical contact with contacts in the state maintained at the temperature, and an eject unit for temporarily holding DUTs finished being tested at the contact unit .

Preferably, at least one unit among the soak unit, the contact unit, or the eject unit have controllers for controlling the units individually (separately) or in common, and the apparatus further has a central managing means for centrally managing the controllers.

Preferably, a component of any unit of the stocker unit, the loader unit, the soak unit, the contact unit, the eject unit, and the unloader unit is modularized to enable exchange, add or reconfigure.

According to a second aspect of the invention, there is provided an electronic device test apparatus having at least one of a stocker unit for storing DUTs before and after testing, a loader unit for unloading DUTs, a soak unit for making the DUTs a target temperature, a contact unit for bringing the DUTs into electrical contact with contacts in a state maintained at the temperature, an eject unit for temporarily holding DUTs finished being tested at the contact unit, and an unloader unit for classifying DUTs finished being tested at the contact unit in accordance with test results, and at least one unit among the units is modularized to enable exchange, add or reconfigure.

Preferably, at least one of the loader unit and the unloader unit has as a component a holder of a moving means for holding and moving DUTs, and the holder is modularized to enable exchange, add or reconfigure at one of the loader unit and the unloader unit.

Preferably, the holder has a controller for controlling the holder, and the central managing means manages the controller .

Preferably, the contact unit has as a component a pushing means for simultaneously pushing a plurality of the DUTs against contacts, and the pushing means is modularized to enable exchange, add or reconfigure at the contact unit.

Preferably, the pushing means has a controller for controlling the pushing means, and the central managing means manages the controller.

Preferably, at least one of the loader unit, the soak unit, the contact unit, the eject unit, and the unloader unit has an inter-unit conveying means for transferring a test tray carrying DUTs or the DUTs themselves to adjoining units.

Preferably, the component of the inter-unit conveying means is modularized to enable exchange, add or reconfigure in the inter-unit conveying means.

Preferably, the component of the inter-unit conveying means is a shuttle supported by a movement mechanism moving reciprocatively between adjoining units and supporting the DUTs .

Preferably, the shuttle has a controller for controlling the shuttle, and the central managing means manages the controller.

According to a third aspect of the invention, there is provided a method of configuring an electronic device test apparatus comprising modularizing to enable exchange, add or reconfigure at least one of the units forming the apparatus for bringing the DUTs into electrical contact with the contacts of the test head and selecting the modularized unit from among a plurality of types of unit of different specifications to configure the electronic device test apparatus.

Preferably, the method further comprises making the units forming the electronic device test apparatus include at least one unit among a stocker unit for storing DUTs before and after testing, a loader unit for unloading the DUTs, a soak unit for making the DUTs a target temperature, a contact unit for bringing the DUTs into electrical contact with contacts, an eject unit for temporarily holding DUTs finished being tested at the contact unit, and an unloader unit for classifying DUTs finished being tested at the contact unit in accordance with the test results, modularizing at least one unit among the units to enable exchange, add or reconfigure, and selecting the modularized unit from among a plurality of types of units of different specifications to configure the electronic device test apparatus.

Preferably, the method further comprises making the units forming the electronic device test apparatus include a plurality of types of handling units of different throughputs for storing DUTs before and after testing, taking out the stored DUTs and unloading them to the test unit, and classifying the DUTs finished being tested at the test unit in accordance with the test results and a plurality of types of test units different in at least one of the number of simultaneous measurements and test temperature for making the DUTs loaded from the handling unit a target temperature and bringing the DUTs into electrical contact with contacts of a test head from which a test pattern is output and from which a response pattern is input, modularizing at least one of the handling unit or the test unit to enable exchange, add or reconfigure, and selecting at least one of a throughput of the corresponding type of the handling unit or the number of simultaneous measurements and/or test temperature of the corresponding type of the test unit to configure the electronic device test apparatus based on the maximum number of measurable pins of a tester outputting a test pattern and examining a response pattern, the number of terminals of the DUTs, and the test time.

Preferably, the method further comprises making the plurality of handling units differ in at least one of the number of simultaneous holdings and the conveyance speed when loading the DUTs so as to make the throughput different.

Preferably, the method further comprises making the handling unit include a stocker unit for storing DUTs before and after testing, a loader unit for taking out DUTs stored in the stocker unit and unloading them to the test unit, and an unloader unit for classifying DUTs finished being tested at the test unit in accordance with test results.

Preferably, the method further comprises making the test unit include a soak unit for making the DUTs loaded from the handling unit a target temperature, a contact unit for bringing the DUTs into electrical contact with contacts in the state maintained at the temperature, and an eject unit for temporarily holding DUTs finished being tested at the contact unit.

Preferably, the method further comprises making the plurality of test units differ in number of DUTs simultaneously brought into contact with the contacts at the contact unit.

Preferably, the method further comprises making the plurality of test units differ in performance in making the DUTs the target temperature at the soak unit and eject unit.

Preferably, the method further comprises modularizing a component of any unit of the stocker unit, the loader unit, the soak unit, the contact unit, the eject unit, and the unloader unit to enable exchange, add or reconfigure and selecting the component to be mounted at the unit from among a plurality of types of components of different specifications.

Preferably, the method further comprises making at least one of the loader unit and the unloader unit include as a component a moving means for moving the DUTs, modularizing a holder for holding the DUTs to enable exchange, add or reconfigure at the moving means, and selecting the holder to be mounted at the moving means from the plurality of types of holders of different specifications.

Preferably, the method further comprises making the contact unit include as a component a pushing means for simultaneously pushing a plurality of the DUTs against contacts, modularizing the pushing means to enable exchange, add or reconfigure at the contact unit, and selecting the pushing means mounted at the contact unit from among of a plurality of types of the pushing means of different specifications.

Preferably, the method further comprises making at least one of the loader unit, the soak unit, the contact unit, the eject unit, and the unloader unit an inter-unit conveying means for transferring a test tray carrying DUTs or the DUTs themselves to adjoining units, modularizing a component of the inter-unit conveying means to enable exchange, add or reconfigure at the inter-unit conveying means, and selecting the component mounted at the inter-unit conveying means from a plurality of types of components of different specifications.

Preferably, the method further comprises making the component of the inter-unit conveying means a shuttle supported by a movement mechanism moving reciprocatively between adjoining units and holding DUTs.

Preferably, the method further comprises forming at constant positions of the handling units and the test units a mechanical interface, electrical interface, software interface, and power connector.

In the electronic device test apparatus and method of configuring an electronic device test apparatus of the present invention, the electronic device test apparatus is modularized in units. Due to this, the electronic device test apparatus can be tailored to required specifications in units, so even when the maximum number of simultaneous measurements is changed due to the relationship between the maximum number of testable pins of the tester and the number of pins of the DUTs, it is possible to configure/change to the optimum system configuration without allowing the efficiency of the test apparatus as a whole to decline due to handler performance.

For example, when modularizing the electronic device test apparatus to a handling module and test module, for the handling module, a plurality of handling modules DUT given different throughputs by being given different numbers of simultaneous holdings at the time of conveyance and/or conveyance speed are prepared. Further, for the test module, for example, a plurality of test modules given different numbers of simultaneous measurements or test temperatures (function of adjustment of temperature of DUTs) are prepared.

Further, the handling module having optimum throughput and the test module having the optimum number of simultaneous measurements and/or test temperature are selected based on the maximum number of measurable pins of the tester, the number of terminals of the DUTs, and the test time so as to configure the electronic device test apparatus.

Due to this, even when the maximum number of simultaneous measurements changes due to the relationship between the maximum number of testable pins of the tester and the number of pins of the DUTs, it is possible to optimize the system configuration without allowing the efficiency of the test apparatus as a whole to decline due to handler performance. As a result, even if the test specifications or test conditions are changed, it is sufficient to change only the minimum necessary extent of the modules, so the design and development time and production costs can be reduced.

According to a third aspect of the present invention, there is provided an electronic device test apparatus comprising a plurality of types of units of different specifications at least one of which is modularized to enable exchange, add or reconfigure, the plurality of types of units being given ID information for identifying their types, selecting a predetermined unit from the plurality of types of units to configure a system, and reading the ID information from the unit and controlling operation in accordance with that unit based on that read ID information.

Preferably, the units configuring the apparatus include a stocker unit for storing DUTs before and after testing, a loader unit for unloading DUTs, a soak unit for making the DUTs a target temperature, a contact unit for bringing the DUTs into electrical contact with contacts, an eject unit for temporarily holding DUTs finished being tested at the contact unit, and an unloader unit for classifying DUTs finished being tested at the contact unit in accordance with test results, at least one unit among the units being modularized to enable exchange, add or reconfigure.

Preferably, the units forming the electronic device test apparatus include a handling unit and a test unit, the handling unit stores DUTs before and after testing, takes out stored DUTs to unload them to the test unit, and classifies the DUTs finished being tested at the test unit in accordance with the test results, the test unit makes the DUTs loaded from the handling unit the target temperature and brings the DUTs into electrical contact with the contacts of the test head from which a test pattern is output and a response pattern is input, and at least one of the handling unit or the test unit is modularized to enable exchange, add or reconfigure . Preferably, provide with unit inherent information which is inherent (specific) in each module and corresponds to the ID information.

Preferably, the apparatus is provided with control software for controlling the operation of each unit in accordance with the configured system configuration.

Preferably, a connection portion for connecting a first unit and second unit configuring the system is mechanically connected to enable DUTs to be loaded and is electrically connected to enable DUTs to be tested.

Preferably, the apparatus operates while freely exchanging a first unit of specifications different from the initially set system configuration and a second unit of specifications different from the configuration.

BRIEF DESCRIPTION OF THE DRAWINGS

These and other objects and features of the present invention will become clearer from the following description of the preferred embodiments given with reference to the attached drawings, wherein:

FIG. 15A is a side view of a variation of a holding head module showing a first type;

FIG. 16 is a disassembled perspective view of the case when mounting a loader/unloader module at the handler shown in FIG. 8;

DESCRIPTION OF THE PREFERRED EMBODIMENTS

Below, embodiments of the present invention will be explained based on the drawings.

First Embodiment

Figure 1:
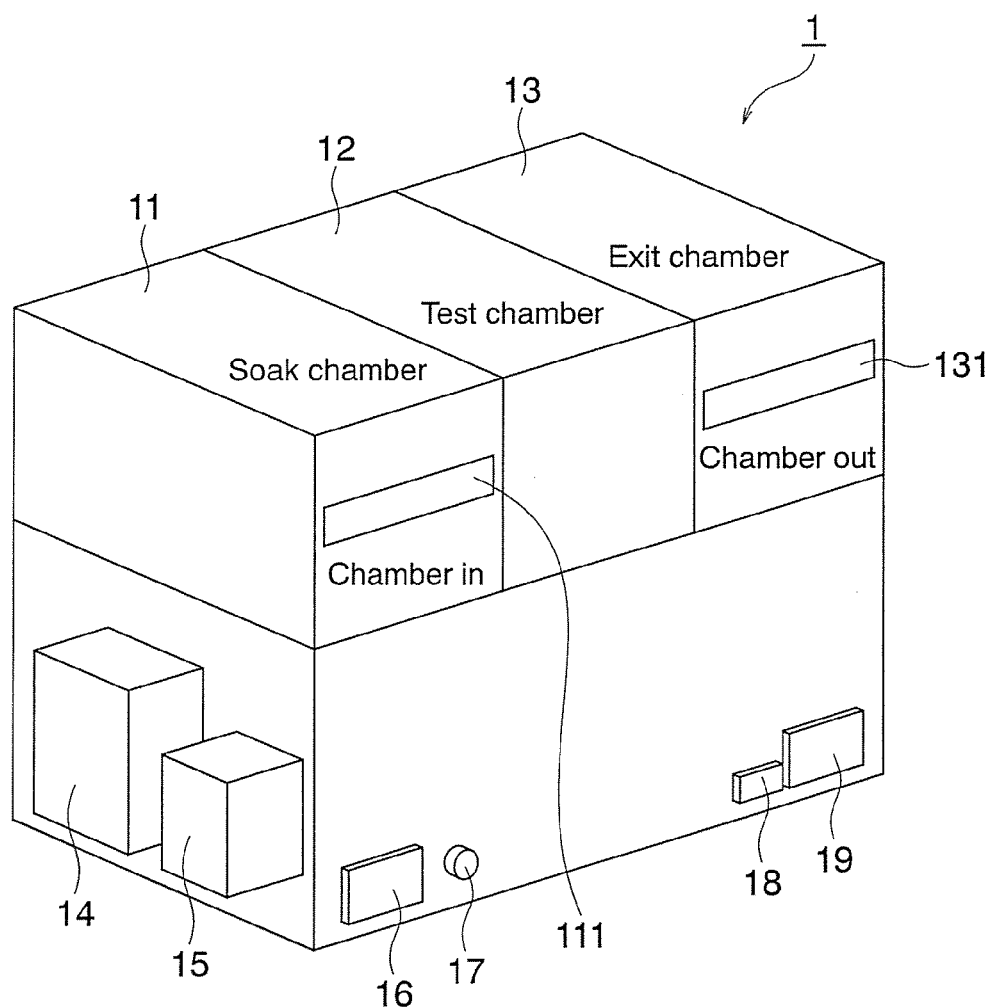
FIG. 1 is a schematic view of a first embodiment of a test module according to the present invention.
Figure 2:
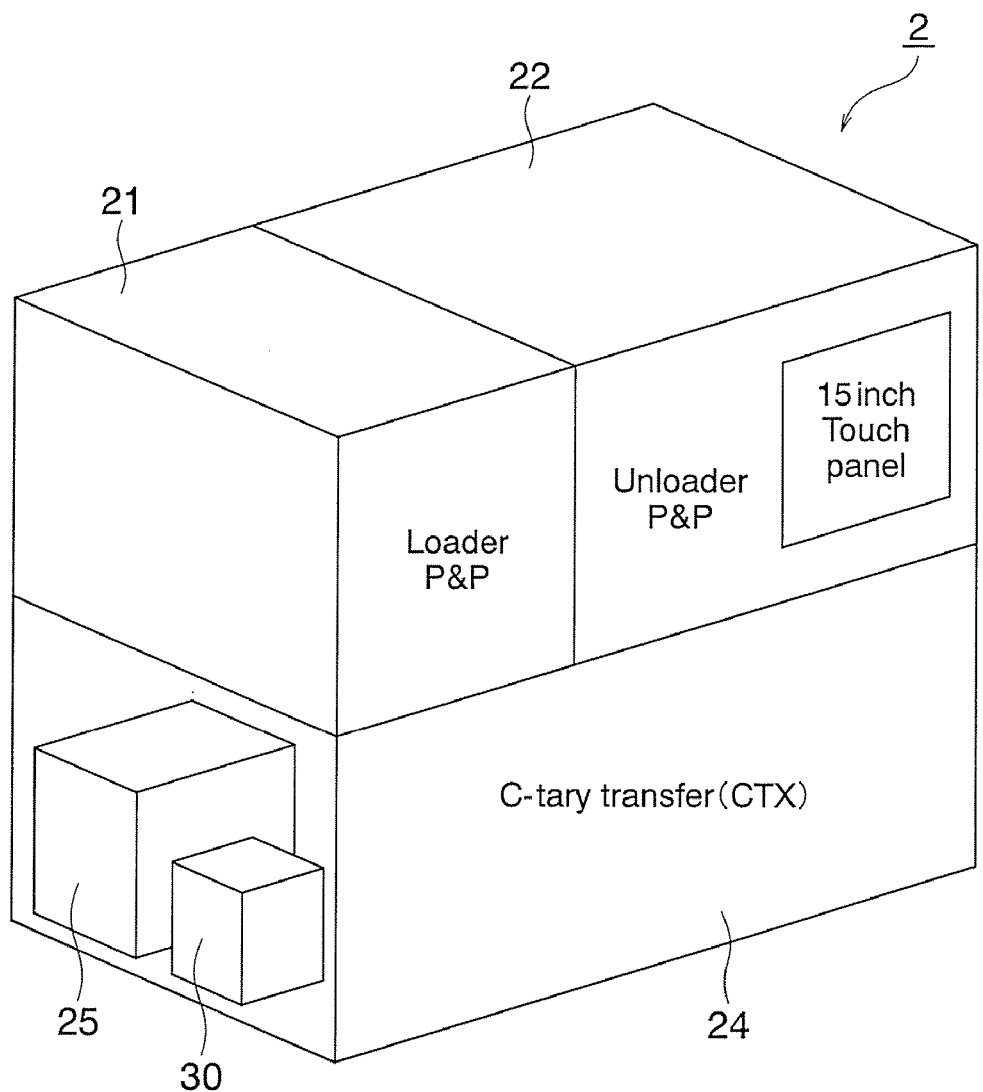
FIG. 2 is a schematic view (front view) of the first embodiment of a handling module according to the present invention.
Figure 3:
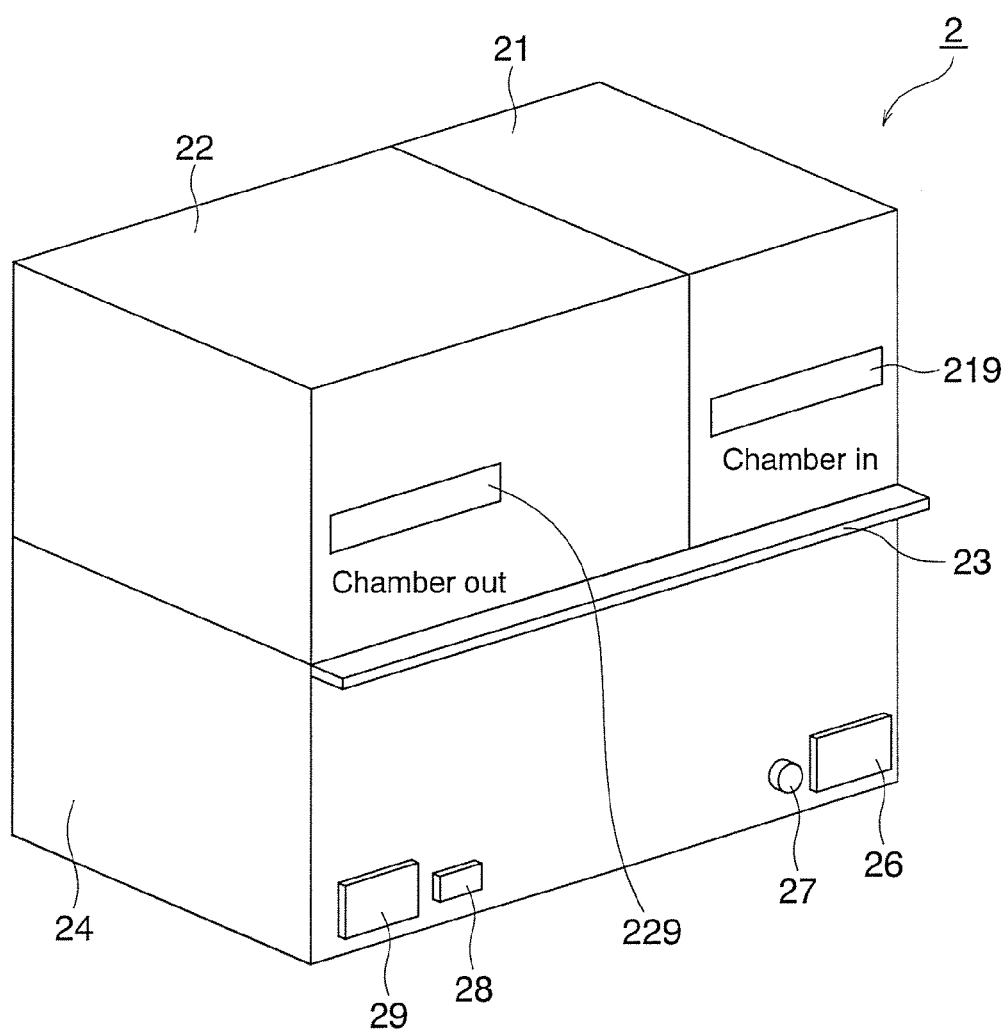
FIG. 3 is a schematic view (back view) of the first embodiment of a handling module according to the present invention.
Figure 4:
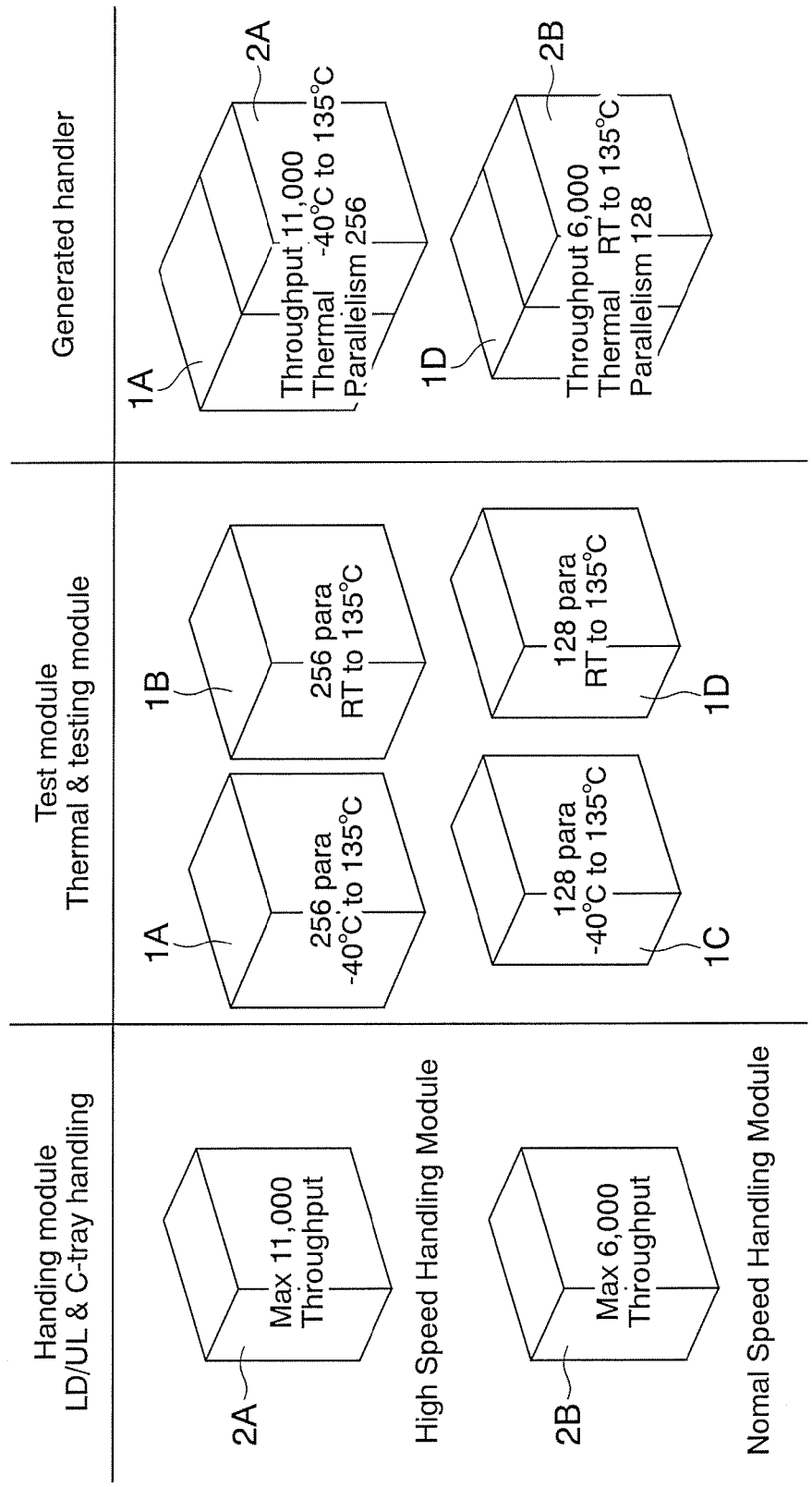
FIG. 4 is a view for explaining the combination of types of handling modules and test modules according to the present invention.
Figure 5:
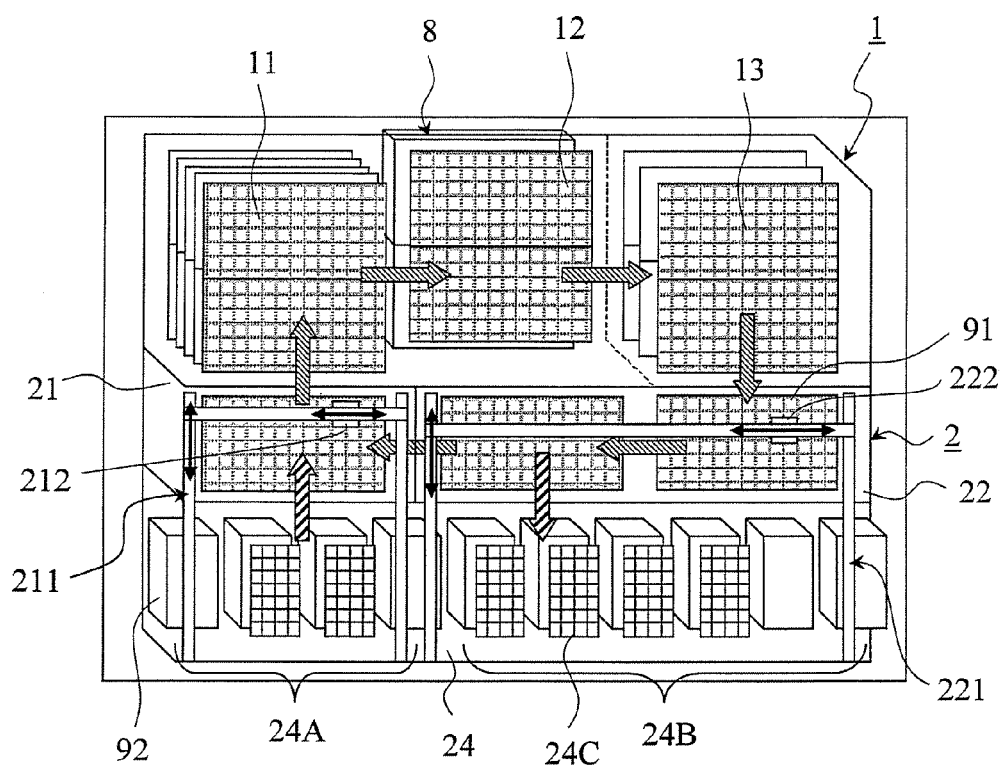
FIG. 5 is a conceptual view of the method of transporting DUTs and trays in an electronic device test apparatus according to the present invention.
Figure 6:
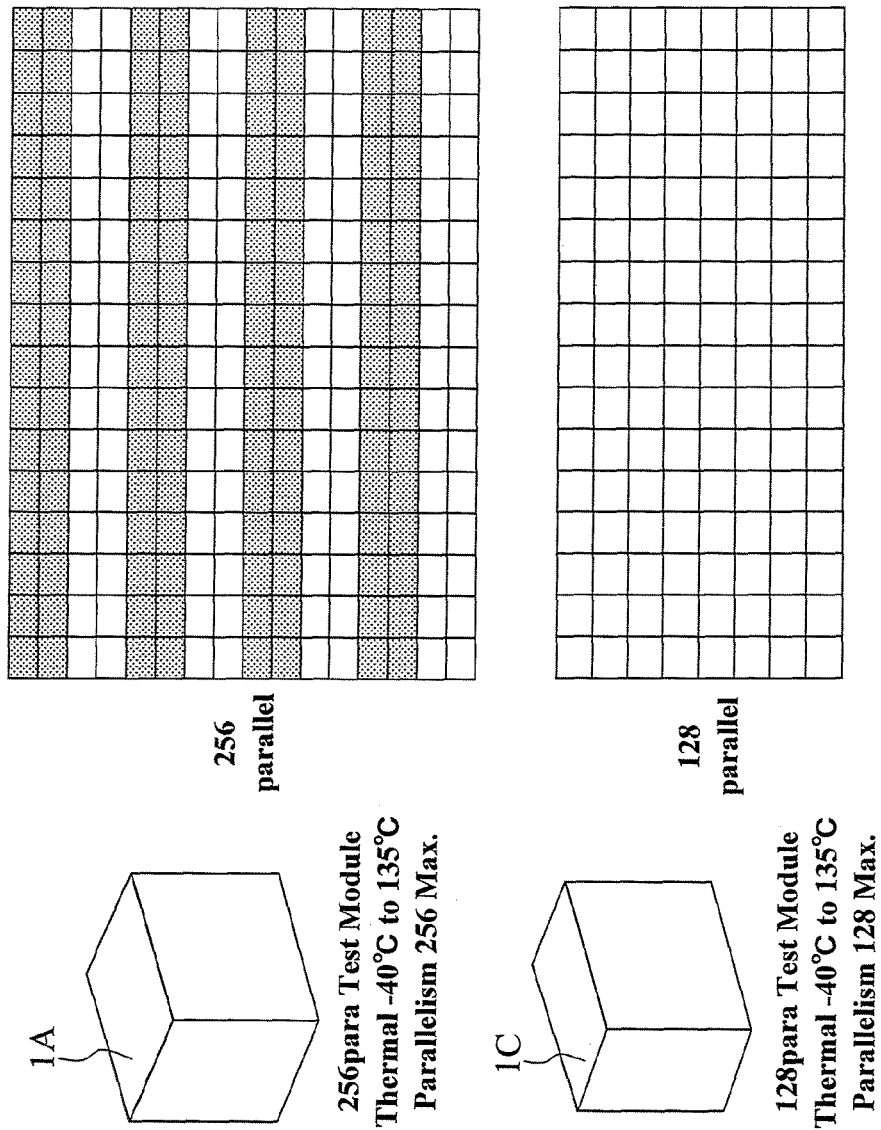
FIG. 6 is a view for explaining the method of selection based on the number of simultaneous measurements of the test module according to the present invention.
Figure 7:
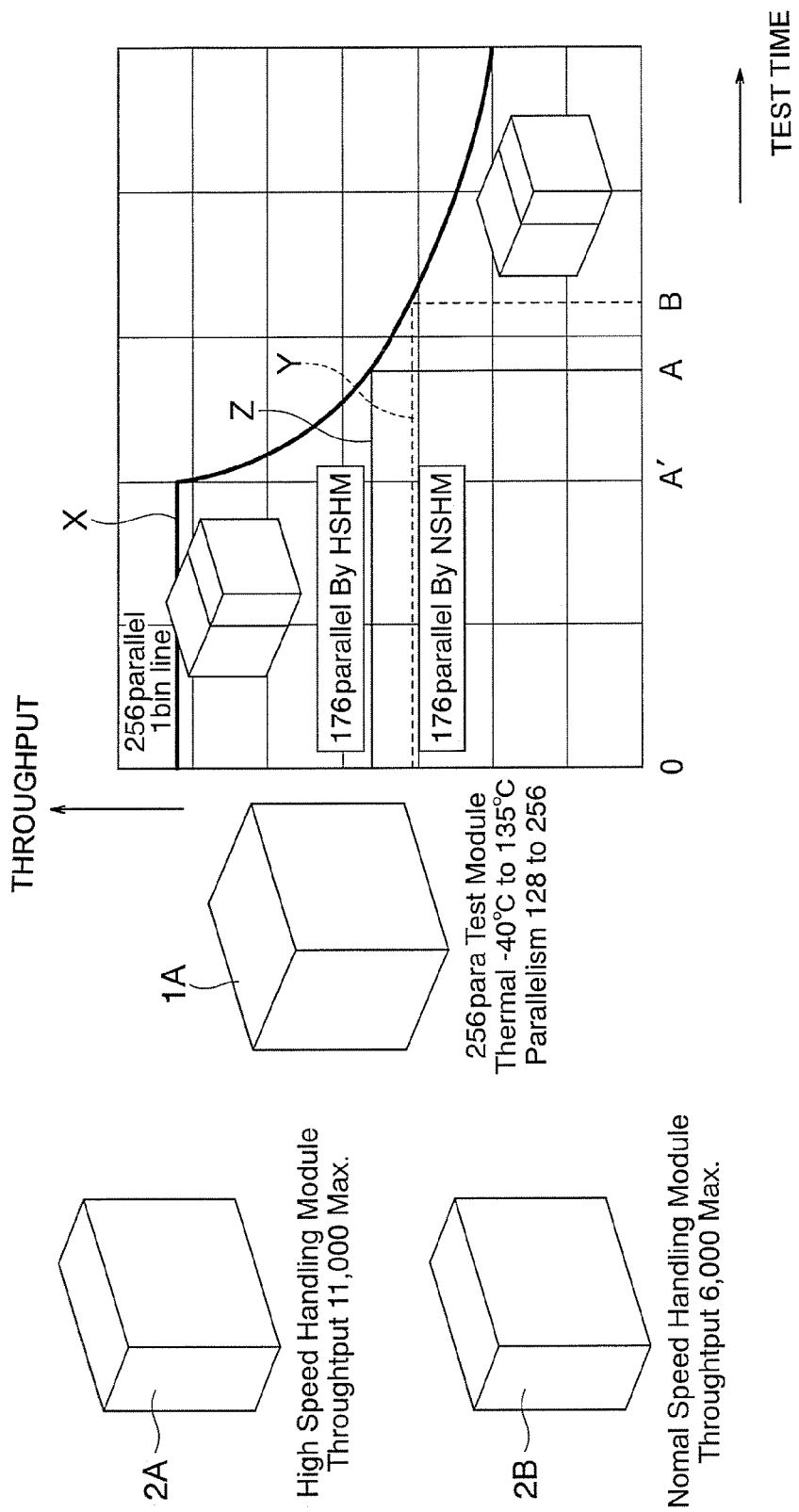
FIG. 7 is a view for explaining the method of selection based on the throughput of the handling module and the number of simultaneous measurements of the test module according to the present invention.

FIG. 1 is a schematic view of a first embodiment of a test module according to the present invention, FIG. 2 is a schematic view (front view) of the first embodiment of a handling module according to the present invention, FIG. 3 is a schematic view of the same (back view), FIG. 4 is a view for explaining the combination of the types of the handling modules and test modules according to the present invention, FIG. 5 is a conceptual view of the method of transporting DUTs and trays in the electronic device test apparatus according to the present invention, FIG. 6 is a view for explaining a selection method based on the number of simultaneous measurements of the test module according to the present invention, and FIG. 7 is a view for explaining a selection method based on the throughput of the handling module and the number of simultaneous measurements of the test module according to the present invention. Note that FIG. 5 is a view for explaining the method of transporting DUTs and trays in the electronic device test apparatus in the present embodiment and shows planarly the members actually arranged in the vertical direction. Therefore, that mechanical (three-dimensional) structure will be explained with reference to FIG. 1 to FIG. 3.

The electronic device test apparatus according to the present embodiment tests DUTs to determine whether the DUTs suitably operate in a state given a desired high temperature or low temperature stress or not given temperature stress at ordinary temperature and classifies the DUTs in accordance with the test results to good devices, defects, and different categories. It is comprised of a handler for successively transferring DUTs to contact terminals provided at the test head, classifying the DUTs finished being tested in accordance with the test results, and storing them at predetermined trays, a tester (not shown) for transmitting a predetermined test pattern and testing and evaluating the DUTs based on the response signals, and a test head 8 having contact terminals and functioning as an interface between the handler and tester (FIG. 5). The tester and test head 8 and the handler and tester are electrically connected through cables and other signal lines etc. Note that the contact terminals include contact terminals for contacting the drive terminals of the DUTs and contact terminals for contacting the input/output terminals of the DUTs. These are referred to overall as "contact terminals". Further, the contact terminals input and output various signals from the tester through sockets and circuit boards provided at the test head.

The test apparatus according to the present invention is mainly comprised of the handler part. In the present embodiment, this handler is comprised of the test module 1 shown in FIG. 1 and the handling module 2 shown in FIG. 2 and FIG. 3.

The test module 1 sets the DUTs loaded from the handling module 2 to the target temperature and brings the DUTs into electrical contact with the contact unit of the test head from which the test pattern is output and to which the response pattern is input.

As shown in FIG. 1 and FIG. 5, the test module 1 of this example is comprised of a soak unit 11 for raising or lowering the DUTs loaded from the handling module 2 to the target temperature, a contact unit 12 for bringing the DUTs into electrical contact with the contact unit in the state maintained in temperature, and an eject unit 13 for temporarily holding the DUTs finished being tested at the contact unit 12. The units are formed to be able to be attached and detached to and from each other. That is, the frames forming the units 12, 13, and 14 forming the test module 1 are standardized. The units can be attached and detached to and from each other through the frames.

Further, the DUTs are transported inside the test module 1 by a test tray 91 as shown in for example FIG. 5. The test tray 91 is designed to be circulated inside the test module 1 and handling module 2 by a not shown conveyor as shown by the arrows. Further, the later mentioned loader unit 21 moves DUTs carried on a customer tray (C-tray) 10 to a test tray 91 and transports this test tray 91 from the soak unit 11→contact unit 12→eject unit 13→unloader unit 22 for testing the DUTs.

The test module 1 of this example, as shown in FIG. 4, comes in four types including a type enabling 256 number of simultaneous measurements in the contact unit 12 and a type enabling 128 and including a type enabling a test temperature of −40° C. to 135° C. in range and a type enabling a test temperature of room temperature to 135° C. in range. That is, as shown in the drawings, there are a type 1A enabling 256 simultaneous measurements and a test temperature of −40° C. to 135° C., a type 1B enabling 256 simultaneous measurements and a test temperature of room temperature to 135° C., a type 1C enabling 128 simultaneous measurements and a test temperature of −40° C. to 135° C., and a type 1D enabling 128 simultaneous measurements and a test temperature of room temperature to 135° C.

The difference between the types enabling 256 and 128 simultaneous measurements is whether 256 or 128 pushers are provided for pushing the DUTs to the contact unit in the contact unit 12. The frames forming the contact units 12 are all formed the same (standard shapes). The layout shown at the top of FIG. 6 is an array of 256 pushers for simultaneous measurement, while the layout shown at the bottom of the figure is an array of 128 pushers for simultaneous measurement. Of course, there are also two types of specifications of the contact unit of the test head: one for 256 sockets and one for 128 sockets.

The difference between the type enabling a range of test temperature of −40° C. to 135° C. and the type enabling one of room temperature to 135° C. is whether the DUTs can be cooled to an extremely low temperature of −40° C. or so. In the former type, the soak unit 11 is provided with a cooling device enabling the DUTs to be cooled to −40° C., while the eject unit 13 is provided with an anti-condensation device for preventing condensation at the DUTs cooled to such a low temperature. Further, in addition to this cooling device and anti-condensation device, a heating device for heating the DUTs to room temperature to 135° C. is provided. As opposed to this, in the latter type test module 1, only the heating device is provided for heating the DUTs to room temperature to 135° C. The cooling device for cooling to an extremely low temperature forms the soak unit by a chamber and passes nitrogen gas or another cooling gas through this chamber. Further, as the anti-condensation device, a device for heating the DUTs maintained at a low temperature to near room temperature can be illustrated.

However, the frames forming the soak unit 11 and eject unit 13 are all the same shapes (standard shapes). Each type of unit can be attached to and detached from the adjoining units.

As shown in FIG. 1, the front side of the soak unit 11 (surface to which later explained handling module 2 is attached) is formed with an inlet opening 111 into which a test tray carrying a large number of DUTs is loaded. Further, the front side of the eject unit 13 is formed with an outlet opening 131 for unloading a test tray finishing being tested at the contact unit 12 and arriving at the eject unit 13 to the handling module 2. Further, these inlet openings 111 and outlet openings 131 are standardized in position and shape (size). All types of soak units 11 and eject units 13 have openings at the same position and of the same shape. Further, corresponding to the inlet opening 111, the loader unit 21 of the handling module 2, as shown in FIG. 3, is formed with an outlet opening 219 of the same position and shape. Similarly, the unloader unit 22 of the handling module 2, as shown in the same figure, is formed with an inlet opening 229 of the same position and shape. Further, when assembling the test module 1 and handling module 2, the inlet opening 111 of the soak unit 11 and the outlet opening 219 of the loader unit 21 are joined and the outlet opening 131 of the eject unit 13 and the inlet opening 229 of the unloader unit 22 are joined. Due to this, the test tray can be transferred between the units.

Note that as shown in FIG. 3, when assembling the test module 1 and handling module 2, it is desirable to provide a member 23 for mechanical positioning of the two at least at one of the modules 1 and 2.

Returning to FIG. 1, the bottom of the frame of the test module 1 is provided with a breaker unit 14 for the power source used at the test module 1, terminal power unit, and control unit 15. Further, at fixed positions at the front side of the test module 1 (surface attached to the handling module 2), a mechanical interface 16 for air pipes forming the circuit of the various fluid pressure cylinders etc., power connector 17, software interface 18 for transmitting and receiving ID data or temperature control data for identifying the modules or units, an electrical interface 19 for the electric motor, sensor, etc. are provided. Further, it is also possible to provide the components at each of the modules.

Here, for the software for controlling the operation of the modules, the ID data identifying the modules is read and software corresponding to the ID data is applied.

Further, it is desirable to prepare in advance software corresponding to possible combinations of modules. In this case, it becomes possible to immediately change and utilize the system configuration of the electronic device test apparatus to correspond to the DUTs. Also, it is provided with the inherent information with respect to each module, for example a motion correcting data or a maintenance count data etc., and the inherent information corresponds to the ID data. Here, it is explained the motion correcting data. There is an error of mechanical position or a difference of moving length etc. with respect to each module. And so the mechanical position or the moving length are measured in advance and saved as the motion correcting data with respect to each module corresponding to the ID data. When the module is exchanged, the error of mechanical position or the difference of moving length is corrected based on the motion correcting data corresponding to the ID data. Whereby, there is an advantage of being unitarily able to control each module by using same logical controlling data without recognizing mechanical error of the exchanged module. Therefore there is an advantage that the different modules are able to be replaced at the point of production at any time. Next, it is explained the maintenance count data. The maintenance count data is save as the number of motion times of each motion element (an suction pad, an air cylinder etc.) or the number of contact times of contact terminals corresponding to the ID data. Whereby, mechanical stress information of each motion element or each consumable part of each module are obtained so that the timing of maintenance or timing of exchanging the consumable part is managed with precision.

These mechanical interface 16, power connector 17, software interface 18, and electrical interface 19 are positioned and shaped to enable connection to the mechanical interface 26, power connector 27, software interface 28, and electrical interface 29 shown in FIG. 3 when assembling the test module 1 and handling module 2.

FIG. 2 and FIG. 3 show the handling module 2 according to the present embodiment. FIG. 2 is a front view in the case of assembly as a handler, while FIG. 3 is a back view mainly showing the surface for attachment with the above-mentioned test module 1. The handling module 2 stores the DUTs before and after testing, takes out the stored DUTs and unloads them to the test module 1, and classifies the DUTs finished being tested at the test module 1 according to the test results.

As shown in FIGS. 2, 3, and 5, the handling module 2 of this example is comprised of a stocker unit 24 for storing DUTs before and after testing, a loader unit 21 for taking out DUTs stored in the stocker unit 24 and unloading them to the test module 1, and an unloader unit 22 for classifying the DUTs finished being tested at the test module 1 according to the test results. The units 21, 22, and 24 are formed to be attachable/detachable. That is, the frames forming the units 21, 22, and 24 forming the handling module 2 are standardized. The units can be attached and detached through these frames.

The handling module 2 of this example, as shown in FIG. 7, comes in two types: a type 2A having a maximum throughput of 11000 devices/hour and a type 2B having a maximum throughput of 6000 devices/hour. These two types differ in the operating speed of the DUT XYZ conveyor apparatuses 211, 221 (so-called "pick and place" conveyor apparatuses, FIG. 5) provided at the loader unit 21 and unloader unit 22 and the number of simultaneously holdable DUTs. The type having a maximum throughput of a large 11000 devices/hour has faster operating speeds of the XYZ conveyor apparatuses 211, 221 and greater number of DUTs able to be held at the same time. Along with the differences in the specifications, the equipment differ tremendously in cost.

The stocker unit 24, as shown in FIG. 5, has a stocker 24A for stacking and storing customer trays 92 carrying pluralities of pre-test DUTs and a stocker 24B for stacking and storing customer trays 92 carrying pluralities of DUTs finished being tested classified in accordance with the test results. Further, a tray conveyor apparatus 24C is used to successively unload customer trays 92 from the stocker 24a in which the pre-test DUTs are stored to the loader unit 21. The DUTs carried on each customer tray 92 are moved to a test tray 91 using the XYZ conveyor apparatus 211 of the above-mentioned loader unit 21. For this reason, the stocker unit 24 and loader unit 21 are provided between them with an opening for transfer of customer trays 92. Similarly, the XYZ conveyor apparatus 221 is used to move DUTs from the test tray 91 on which the tested DUTs are carried to the customer trays 92 according to the test results. The customer trays 92 are conveyed to the stocker 24B of the stocker unit 24 using a tray conveyor apparatus 24C. For this reason, the stocker unit 24 and unloader unit 22 are provided between them with an opening for transfer of the customer trays 92.

The stocker unit 24 sometimes has to be changed to a different stocker unit depending on the type or shape of the customer trays. In this case, it may be changed to the corresponding stocker unit 24 in the present invention. Therefore, the electronic device test apparatus is made more general in applicability.

Returning to FIG. 2, the bottom part of the frame of the handling module 2 is provided with a main power source 25 used for the handling module 2 and a control unit 30.

In the electronic device test apparatus according to the present embodiment configured in this way, the desired types of modules are selected and combined from the two types of handling modules 2 shown in FIG. 4 and four types of test modules 1. The handling modules 2 come in two types: type 2A having a maximum throughput of 11000 devices/hour and type 2B having a maximum throughput of 6000 devices/hour, so the specifications required for the line are selected. However, note that due to the test time of the DUTs, sometimes the maximum throughput can be realized and sometimes it cannot.

Explaining this point, FIG. 7 is a graph plotting the throughput on the ordinate and the test time on the abscissa for the handler of this example. The "X" in the figure shows the throughput when using a handling module 2A having a maximum throughput of 11000 devices/hour. That is, when the test time of the DUTs is A' hours or less, a capacity of 11000 devices/hour is realized. If the test time exceeds A', the throughput falls. As opposed to this, the "Y" of the figure shows throughput when using a handling module 2B having a maximum throughput of 6000 devices/hour. When the test time is B or less, the maximum throughput of 6000 devices/hour is realized, but when the test time exceeds B, the throughput falls. Here, when the test time on a semiconductor production line exceeds B, the throughput is the same whether using a handling module of the type 2A or using one of the type 2B, so from the viewpoint of the cost performance, it can be said to be suitable to employ the handling module 2B. Similarly, when the test time is A' or less, the handling module 2A realizes its maximum throughput, so from the viewpoint of productivity, it can be said to be suitable to employ the handling module 2A. Further, when the test time is a time A between A' to B, as shown by "Z" in the figure, there is a difference in throughput. If this difference in throughput more than makes up for the difference in cost, it is suitable to employ the handling module 2A, but when it does not, employing the handling module 2B is suitable cost-wise. The handling modules 2A and 2B are selected from these viewpoints. In this way, in this application, it is possible to combine modules with difference performances. Due to this, there is the great advantage that even if the test head connected to is changed or the type of DUTs to be tested change from the initially set system configuration, the optimum system configuration for the DUTs can be changed to. Therefore, there is the great advantage that it is possible to flexibly and effectively utilize the electronic device test apparatus. Further, instead of developing and producing individual electronic test apparatuses for new devices like in the past, it is sufficient to develop, produce, and utilize just the corresponding modules, so it is possible to realize an electronic device test apparatus aimed at shortening the time. Further, the system cost can also be reduced. Further, at temporary shutdowns for repair or maintenance of malfunctioning modules, it is also possible to temporarily change to replacement modules with the same or different performances so as to test the DUTs, so the temporary shutdowns of the system can be greatly shortened and as a result the operating time can be substantially improved.

As opposed to this, the test module 1 comes in the four types 1A to 1D shown in the figure, so the specifications required for the line are selected considering the number of simultaneous measurements and the test temperature. For example, when requiring a very low temperature test of a test temperature of −40° C., the type 1A or 1C is selected.

FIG. 4 shows examples of combinations at the right end. The top row of the right end of the figure shows an electronic device test apparatus configured using a handling module 2A having a maximum throughput of 11000 devices/hour and a test module 1A having a number of simultaneous measurements of 256 devices and a test temperature of −40° C. to 135° C., while the bottom row of the same shows an electronic device test apparatus configured using a handling module 2B having a maximum throughput of 6000 devices/hour and a test module 1D having a number of simultaneous measurements of 128 devices and a test temperature of room temperature to 135° C. The former test apparatus can handle a broad test range and is good in test efficiency, but has the defect that the cost rises by that amount, while the latter test apparatus features the opposite. Therefore, it is important to balance the performance and cost in accordance with the test specifications which the semiconductor production line requires, but the electronic device test apparatus of the present embodiment can be later reconfigured in the test module 1 and handling module 2 even after once being configured. At that time, several of the units forming the modules 1 and 2 can be changed.

In this way, in the electronic device test apparatus of the present embodiment, even if the maximum number of simultaneous measurements is changed due to the relationship between the maximum number of testable pins of the tester and the number of pins of the DUTs, it is possible to optimize the electronic device test apparatus without allowing the efficiency of the test apparatus as a whole to decline due to the performance of the handler. As a result, even if the test specifications or test conditions change, it is sufficient to change only the minimum necessary extent of modules, so the design and development time and the production costs can be reduced.

In the first embodiment explained above, the test module 1 and the handling module 2 were configured as separate modules able to be connected to each other and configured with each other, but in the test module 1, the soak unit 11, contact unit 12, and eject unit 13 and in the handling module 2, the stocker unit 24, loader unit 21, and unloader unit 22 can further be modularized. Further, the suction heads of the XYZ conveyor apparatus, the pushers against the contacts, etc. in the units can further be modularized.

In the following second embodiment, the case of modularizing the lower level units of the test module 1 and handling module 2 and combining them to form a handler will be explained.

Second Embodiment

Figure 8:
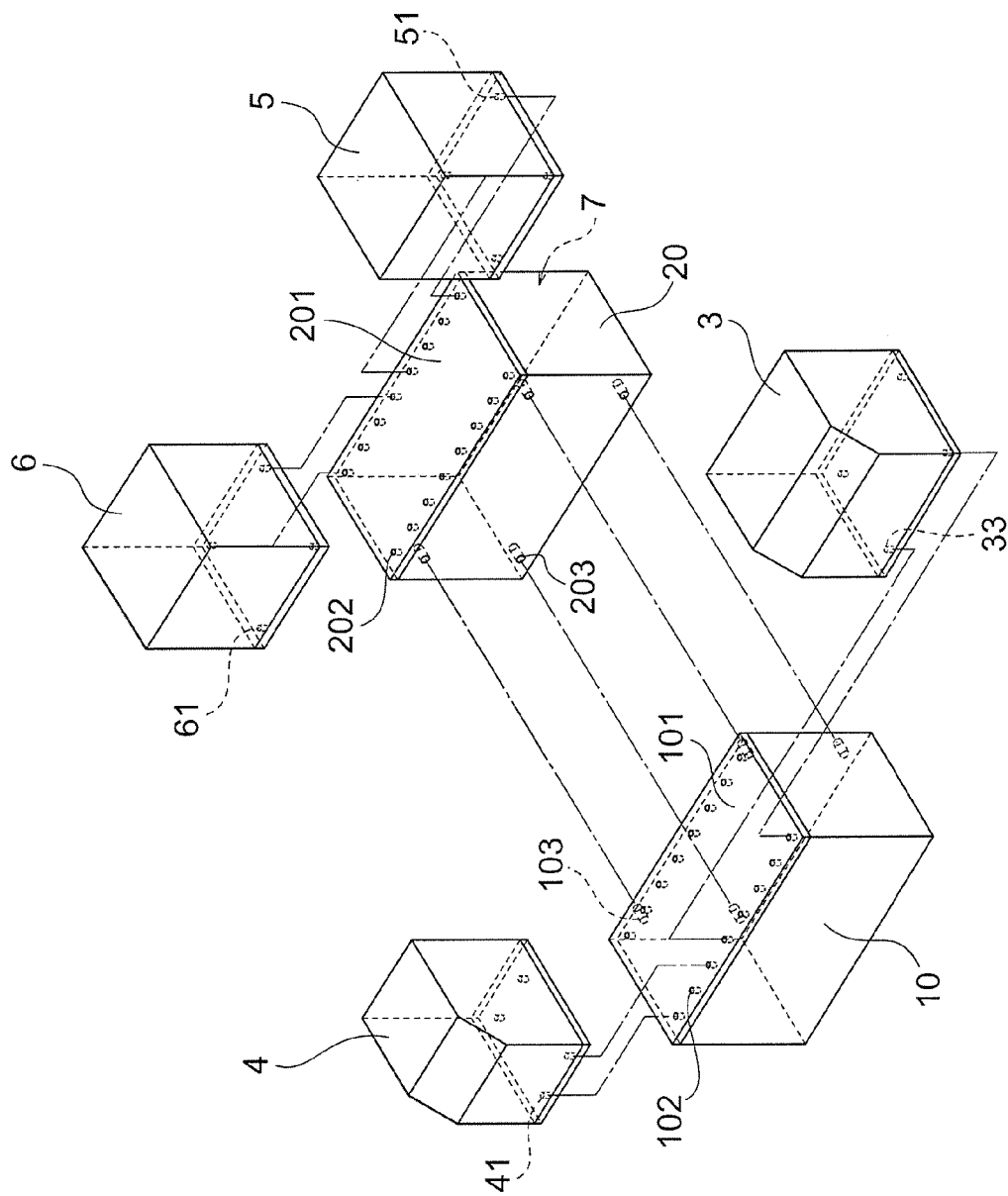
FIG. 8 is a disassembled perspective view of a second embodiment of a handler according to the present invention.
Figure 9:
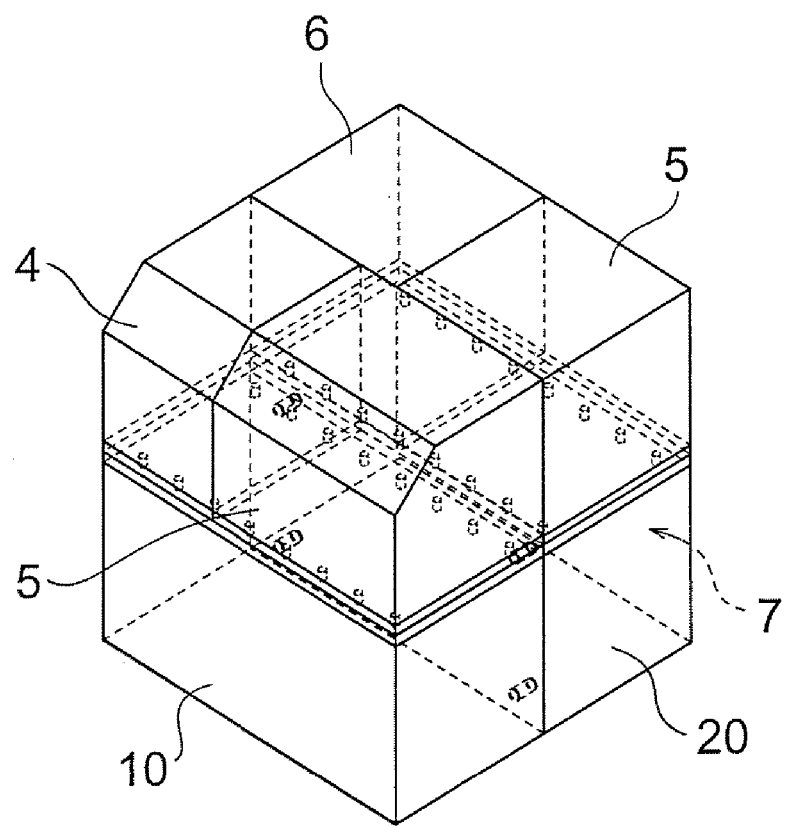
FIG. 9 is a perspective view of a second embodiment of a handler according to the present invention.

FIG. 8 is a disassembled perspective view of a second embodiment of a handler according to the present invention, while FIG. 9 is a perspective view of the handler shown in FIG. 8 assembled.

The handler according to the present embodiment is comprised of a contact module 3, eject module 4, loader module 5, unloader module 6, and stocker module 7. These modules 3 to 7 comprise the lower level units 11 to 13, 21, 22, and 24 of the test module 1 and handling module 2 in the first embodiment formed into modules. There, this "modularization" means forming the units forming the electronic device test apparatus to be separable and connectable from and to their adjoining units and preparing two or more units of different specifications as replacement units.

Figure 10:
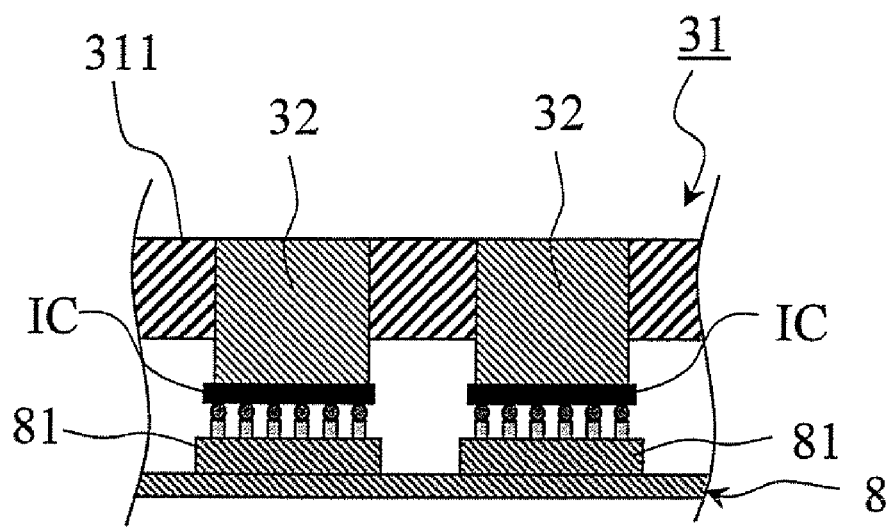
FIG. 10 is an enlarged sectional view of a pusher module in a second embodiment of the present invention.
Figure 11A:
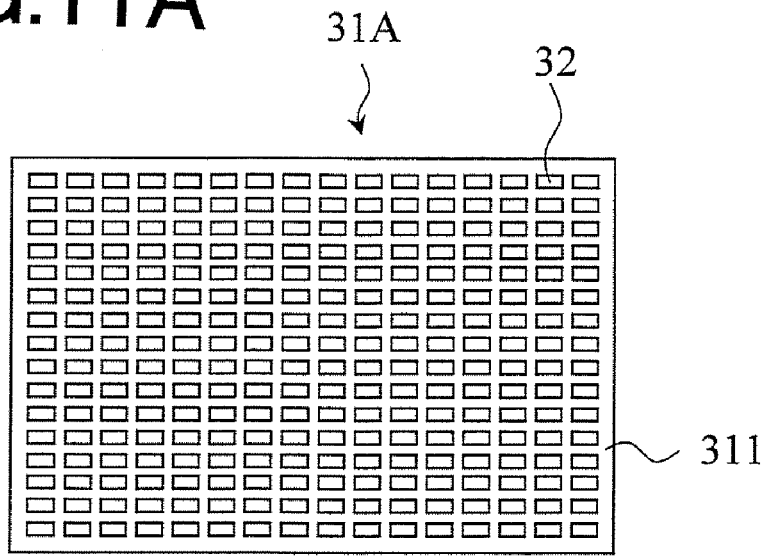
FIG. 11A is a plan view of a variation of the pusher module having 256 pushers.
Figure 11B:
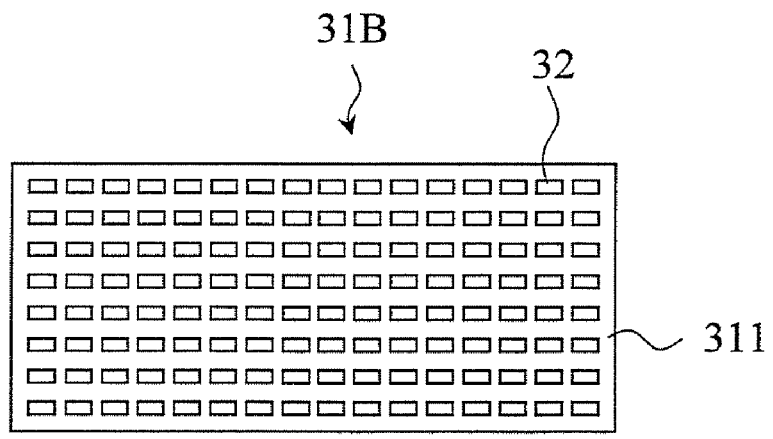
FIG. 11B is a plan view of a variation of a pusher module having 128 pushers.
Figure 12:
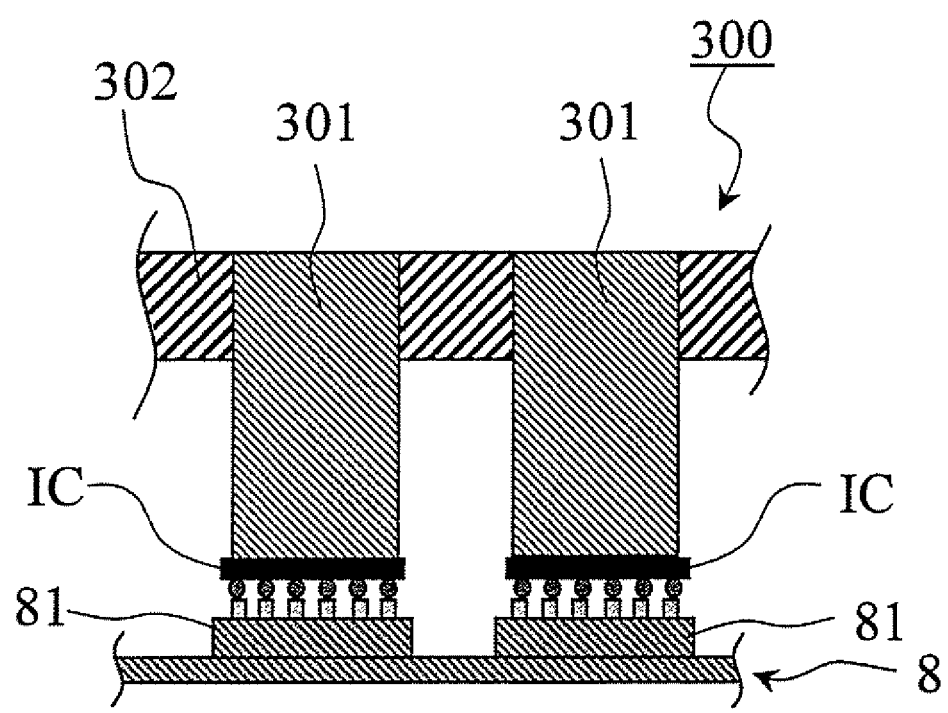
FIG. 12 is a side view of a contact arm module.
Figure 13A:
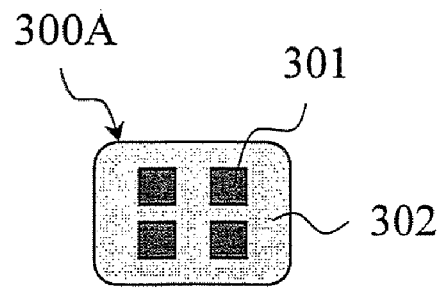
FIG. 13A is a side view of a variation of the contact arm module having four contact arms.
Figure 13B:
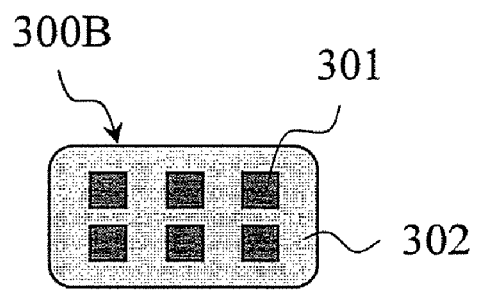
FIG. 13B is a side view of a variation of the contact arm module having six contact arms.
Figure 13C:
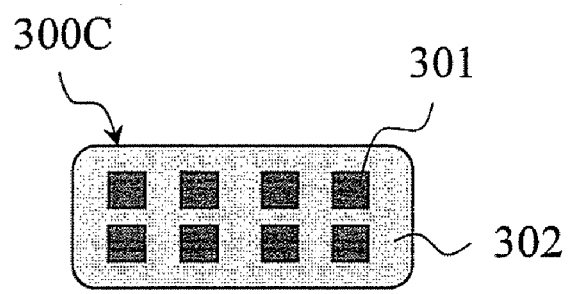
FIG. 13C is a side view of a variation of the contact arm module having six contact arms.

FIG. 10 is a side view of a pusher module in the second embodiment of the present invention, FIG. 11A and FIG. 11B are plan views showing variations of a pusher module, FIG. 12 is a side view of a contact arm module, and FIG. 13A to FIG. 13C are plan views showing variations of a contact arm module.

The contact module 3 is comprised of the soak unit 11 and contact unit 12 in the first embodiment formed into a single module. As variations of this contact module 3, for example, in the same way as the first embodiment, two types with different ranges of test temperature may be mentioned.

This contact module 3, as shown in FIG. 10, is provided with a number of pushers 32 corresponding to the number of simultaneous measurements. The pushers 32 simultaneously push DUTs against the contacts 81 for testing. In the present embodiment, the number of simultaneous measurements worth of pushers 32 are attached to a base member 311 to form a submodule of a pusher module 31. This pusher module 3 can be separated from and connected to the contact module 3.

As variations of this pusher module 31, for example, the type 31A provided with 256 pushers 32 as shown in FIG. 11A and the type 31B provided with 128 pushers 32 as shown in FIG. 11B are provided.

Note that in a logic IC test apparatus, instead of the pushers, as shown in FIG. 12, it is also possible to attach a plurality of contact arms 301 to the base member 302 to modularize them as a contact head module 300. As variations of the contact arm module 300, for example, as shown in FIG. 13A to FIG. 13C, different types 300A to 300C having four, six, and eight contact arms may be mentioned. Note that it is also possible to change the shapes (sizes), arrays, mechanisms, etc. of the contact arms to change the specifications of the contact arm module.

In the present embodiment, first, a contact module 3 of any of the two types is selected based on the required test temperature. Next, either the type 31A or 31B of pusher module is selected based on the required number of simultaneous measurements. Further, the selected pusher module is attached to the contact module 3.

By submodularizing the plurality of pusher 32 in the contact module 3 as a pusher module 31 in this way, it is possible to flexibly configure/change to the optimum system configuration without changing the contact module 3 as a whole.

The eject module 4 is comprised of the eject unit 13 in the first embodiment modularized. As variations of this eject module 4, two types, for example, a type provided with only a heating device and a type provided with a heating device and anti-condensation device, may be mentioned.

In the present embodiment, as shown in FIG. 8 and FIG. 9, the contact module 3 and eject module 4 are provided on the first main frame 10. This first main frame 10 is formed on its base 101 with a plurality of guide holes 102 at predetermined pitches. As opposed to this, the contact module 3 is provided at the four corners of its bottom surface with a plurality of guide pins 33 sticking out facing downward. The guide pins 33 are provided at intervals of whole multiples of the pitch of the guide holes 102 (in the example shown in FIG. 8, a two-fold multiple). Similarly, the eject module 4 is provided at the four corners of its bottom surface with a plurality of guide pins 41 sticking out facing downward. The guide pins 41 are also provided at intervals of whole multiples of the pitch of the guide holes 102 (in the example shown in FIG. 8, a four-fold multiple). Further, by fitting the guide pins 33 and 41 into the guide holes 102, the contact module 3 and eject module 4 are positioned with respect to the first main frame 10. After this positioning, for example, bolts, clamps, magnetic force, etc. are used to fasten the contact module 3 and eject module 4 to the first main frame 10.

Modules of types having different specifications are also fabricated standardized based on the pitch of the guide holes 102 of the first main frame 10. Further, even when newly producing modules, they are fabricated standardized based on the pitch of the guide holes 102.

Figure 14:
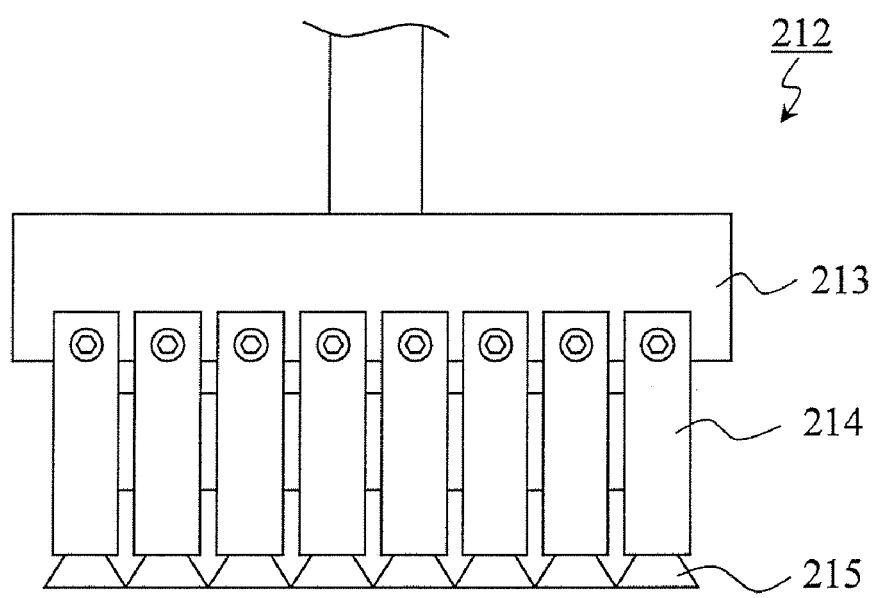
FIG. 14 is a side view of a holding head module of an XYZ conveyor apparatus in a second embodiment of the present invention.

FIG. 14 is a side view of a holding head module of an XYZ conveyor apparatus in the second embodiment of the present invention, while FIG. 15A to FIG. 15D are side views of variations of a holding head module.

The loader module 5 and unloader module 6 are comprised of the loader unit 21 and unloader unit 22 in the first embodiment modularized. XYZ conveyor apparatuses for conveying the DUTs (corresponding to 211 and 221 in FIG. 5) are provided at the modules 5, 6. For this reason, these modules 5 and 6 are suitable for the case where the test time is relatively short and fast loading and unloading are required.

The XYZ conveyor apparatuses 211, 221 provided at the modules 5, 6 have movable heads 212, 222 able to move in the X-Y-Z directions. The movable heads 212 and 222, as shown in FIG. 14, have a plurality of holding heads 214 able to pick up and hold DUTs by suction pads 215 and a base member 213 to which the plurality of holding heads 214 are attached.

The base member 213 is provided with connection ports for individually supplying individual holding head modules with electric power, drive power, etc. and a bus line to which I/O controllers of the modules are connected.

In the present embodiment, the holding heads 214 are submodularized as holding head modules which can be separated from and connected to the XYZ conveyor apparatuses 211 and 221. As variations of the holding head modules, the types shown in FIG. 15A to FIG. 15D may be mentioned.

Figure 15B:
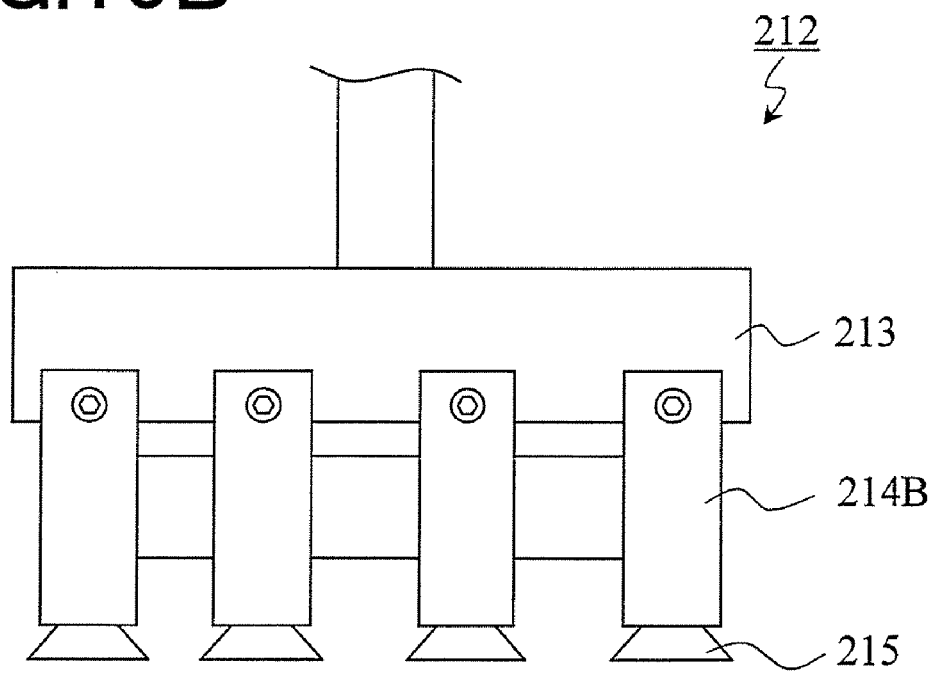
FIG. 15B is a side view of a variation of a holding head module showing a second type.

The variation shown in FIG. 15A is a first type 214A having one or more (in the example shown in FIG. 15A, one) suction pads 215. In the example shown in FIG. 15A, four holding head modules 214A are bolted to the base member 213. The variation shown in FIG. 15B is a second type 214B with a large shape (size) of a holding hand 215 for handling large sized DUTs.

Figure 15C:
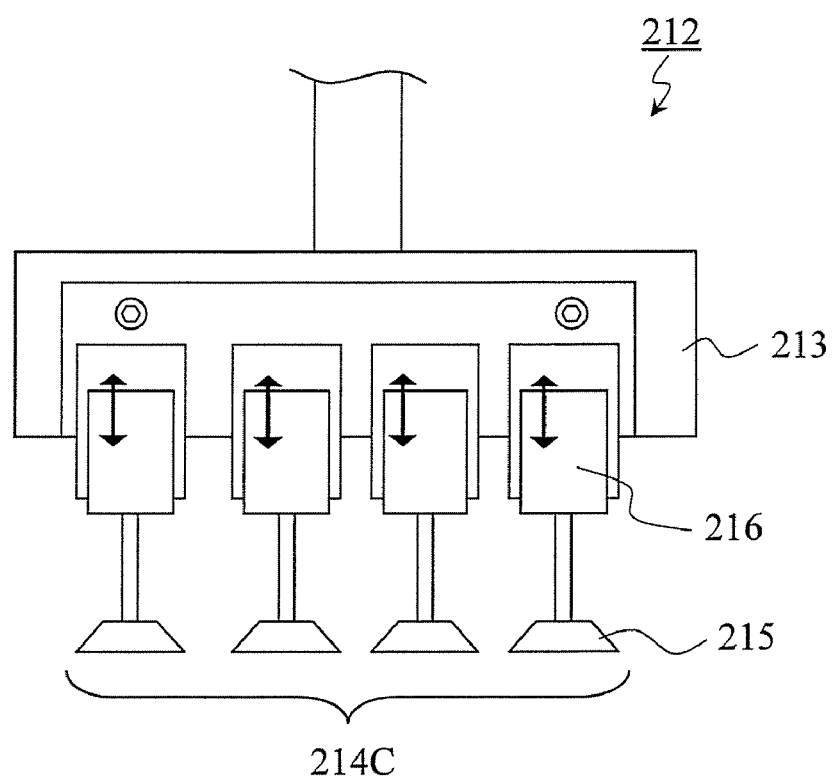
FIG. 15C is a side view of a variation of a holding head module showing a third type.
Figure 15D:
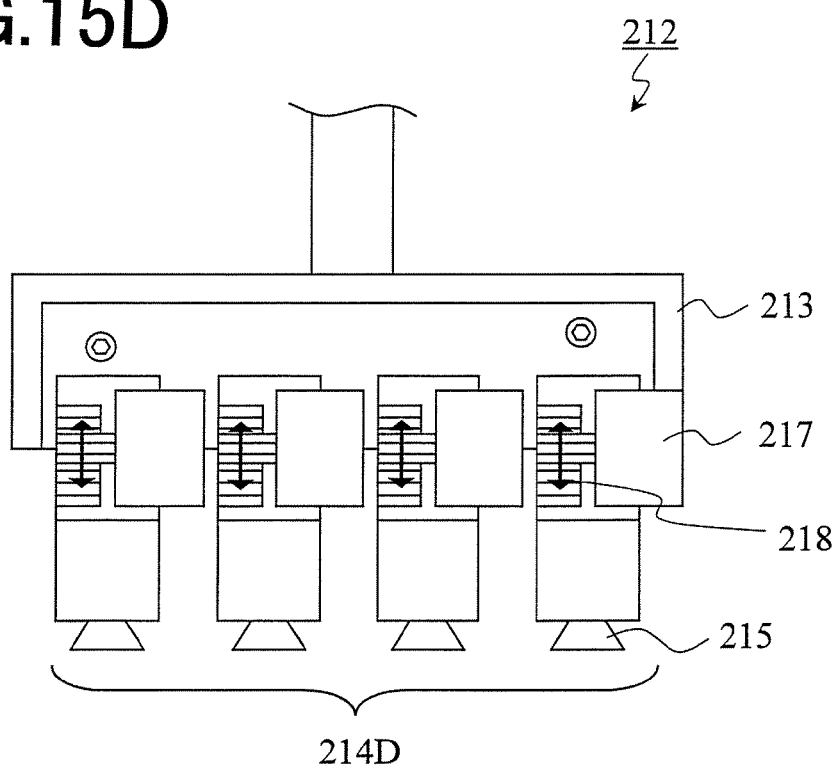
FIG. 15D is a side view of a variation of a holding head module showing a fourth type.

The variation shown in FIG. 15C is a third type 214C using an air cylinder 216 as a buffer mechanism. The variation shown in FIG. 15D is a fourth type 214D using a motor 217 and a rack and pinion mechanism 218 as a buffer mechanism. A holding head module 214C of the type shown in FIG. 15C is low in cost, but inferior in buffering ability, so is suitable for low speed processing. As opposed to this, a holding head module 214D of the type shown in FIG. 15D is high in cost, but is superior in buffering performance, so is suitable for high speed processing. Note that the holding head modules 214C and 214D of the third and fourth types have four suction pads 215.

By changing to the holding head modules 214A to 214C of the above variations in accordance with the size of the DUTs, the test time, etc., it is possible to flexibly configure/change the system configuration without changing the loader module 5 or unloader module 6 as a whole.

As shown in FIG. 8 and FIG. 9, the loader module 5 and unloader module 6 are provided on a second main frame 20. This second main frame 20 is formed on its base 201 with a plurality of guide holes 202 at predetermined pitches. As opposed to this, the four corners of the bottom surfaces of the loader module 5 and unloader module 6 are provided with pluralities of guide pins 51, 61 sticking out downward. The guide pins 51, 61 are provided at intervals of whole multiples of the pitch of the guide holes 202 (in the example shown in FIG. 8, both four-fold multiples). Further, by fitting the guide pins 51 and 61 into the guide holes 202, the loader module 5 and unloader module 6 are positioned with respect to the second main frame. After this positioning, for example, bolts, clamps, magnetic force, etc. are used to fasten the loader module 5 and unloader module 6 to the second main frame 10.

Modules of types having different specifications are also fabricated standardized based on the pitch of the guide holes 202 of the second main frame 20. Further, even when newly producing modules, they are fabricated standardized based on the pitch of the guide holes 202.

The stocker module 7 comprises the stocker unit 24 in the first embodiment modularized. In the present embodiment, this is provided inside the second main frame 20. This stocker module 7 transfers customer trays to and from the loader module 21 and unloader module 22 through an opening (not shown) formed in the base 21. The stocker module 7 sometimes has to be changed to a different stocker module depending on the type or shape of the customer tray. In this case, since the corresponding stocker module 7 can be changed to in the present invention, the electronic device test apparatus can be made more generally applicable.

Further, as shown in FIG. 8 and FIG. 9, the first main frame 10 to which the contact module 3 and eject module 4 are fastened and the second main frame 10 to which the loader module 5 and unloader module 6 are fastened are fixed in place. The first main frame 10 is provided with guide pins 103 at the four corners of the surface facing the second main frame. As opposed to this, the second main frame is formed with guide holes 203 at positions facing the guide pins 103. Further, by fitting the guide pins 102 into the guide holes 202, the first main frame 10 and the second main frame 20 are positioned together. After this positioning, for example, bolts, clamps, magnetic force, etc. are used for fastening the main frames 10, 20.

Figure 17:
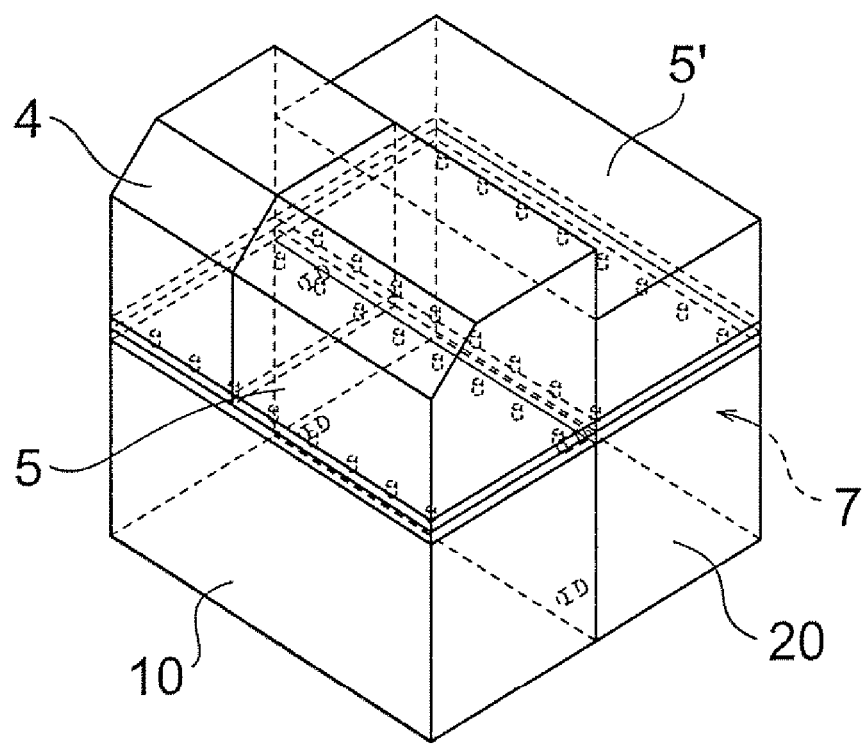
FIG. 17 is a perspective view of the handler shown in FIG. 16 assembled.

FIG. 16 is a disassembled perspective view of the case mounting a loader/unloader module at the handler shown in FIG. 8, while FIG. 17 is a perspective view of the handler shown in FIG. 16 assembled.

In the present embodiment, as shown in FIG. 16 and FIG. 17, a loader module 5' of different specifications from the above modules 5 and 6 is also prepared. This loader module 5', as shown in FIG. 14 and FIG. 15, is comprised of a loader unit 21 and unloader unit 22 formed as an integral module and is designed to use a single XYZ conveyor apparatus for both the loader side and unloader side. Therefore, when the test time is relatively long and a fast loader and unloader are not required, the above-mentioned loader module 5 and unloader module 6 are replaced by the loader module 5'.

This loader module 5' is provided at the four corners of its bottom surface with guide pins 51' at intervals of whole multiples of the pitch of the guide holes 202 (in the example shown in FIG. 16, a seven-fold multiple) so as to enable the loader module 5' to be positioned at the second main frame 20.

Figure 18:
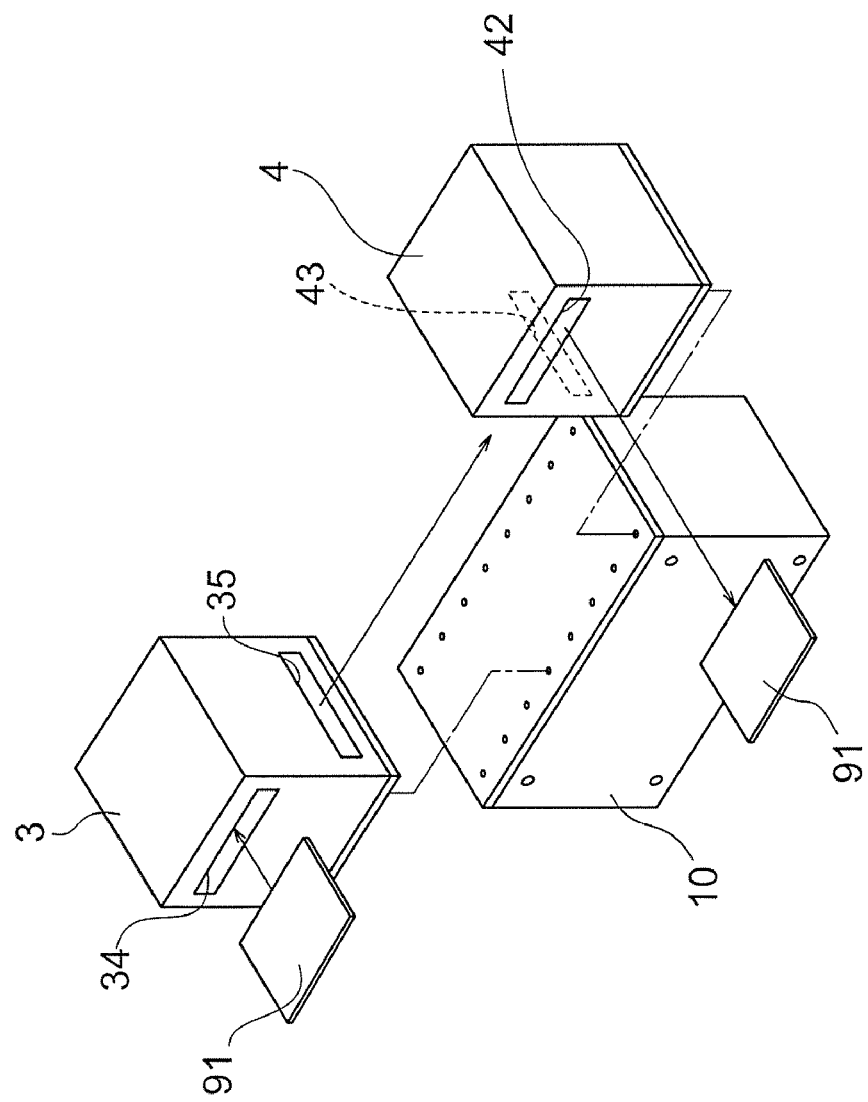
FIG. 18 is a disassembled perspective view of a contact module and eject module in a second embodiment of the present invention.
Figure 19:
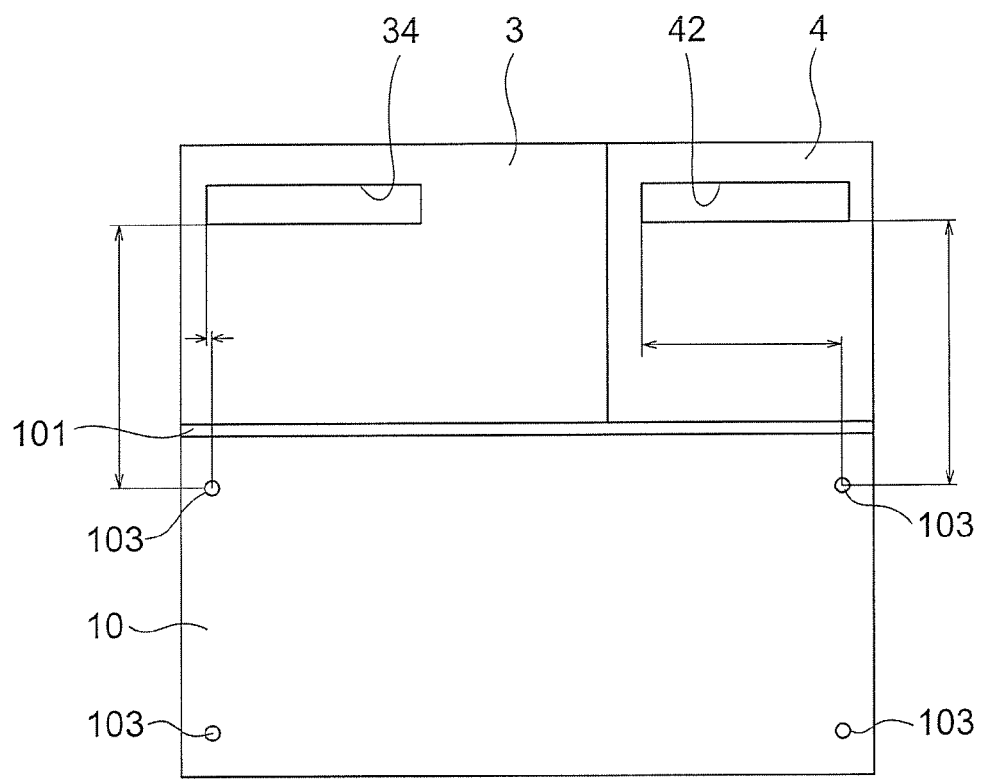
FIG. 19 is a front view of the contact module and eject module shown in FIG. 18.

FIG. 18 is a disassembled perspective view of a contact module and eject module in the second embodiment of the present invention, while FIG. 19 is a front view of the contact module and eject module shown in FIG. 18.

In the handler configured from the modules 3 to 7 in this way, it is necessary to transfer DUTs between the modules. As the method of transferring DUTs among the modules, the method of transferring a test tray 91 carrying the DUTs and the method of transferring the DUTs themselves may be mentioned.

In the present embodiment, the former method is employed to convey a test tray 91 along the route of the loader module 5→contact module 3→eject module 4→unloader module 6→loader module 5 for testing the DUTs.

In the present embodiment, to transfer the test tray 91 between modules, as shown in FIG. 18 and FIG. 19, the front side of the contact module 3 (surface to which the loader module 5 is attached) is formed with an inlet opening 34 through which the test tray 91 is loaded. Further, the front side of the eject module 4 is formed with an outlet opening 42 through which the test tray is unloaded. Further, these openings 34, 42 are formed positioned, as shown in FIG. 19, based on the guide pins 103 provided at the first main frame 10. Further, these opening 34, 42 are standardized in shape (size).

While not particularly shown, the loader module 5 is formed with an outlet opening of the same position and shape corresponding to the inlet opening 34 of the contact module 3. Similarly, the unloader module 6 is also formed with an inlet opening of the same position and shape corresponding to the outlet opening 52 of the eject module 4.

Further, as shown in FIG. 18, another surface of the contact module 3 (surface to which the eject module 4 is attached) is formed with an outlet opening 35 through which the test tray is unloaded. Further, the eject module 4 is formed with an inlet opening 43 of the same position and shape corresponding to this outlet opening 35. Further, when assembling the contact module 3 and eject module 4, the openings 35, 43 are communicated. While not particularly illustrated, openings are also formed communicating the unloader module 6 and loader module 5.

Further, the modules are provided between them with a belt conveyor (not shown) bridging the communicated openings. This belt conveyor is used to transfer test trays 91 from a prior process (prior module) to a later process (later module). Note that as a mechanism for conveying a test tray 91 between modules, in addition to a belt conveyor, an air cylinder, ball-screw mechanism, or other mechanism may be mentioned.

Figure 20:
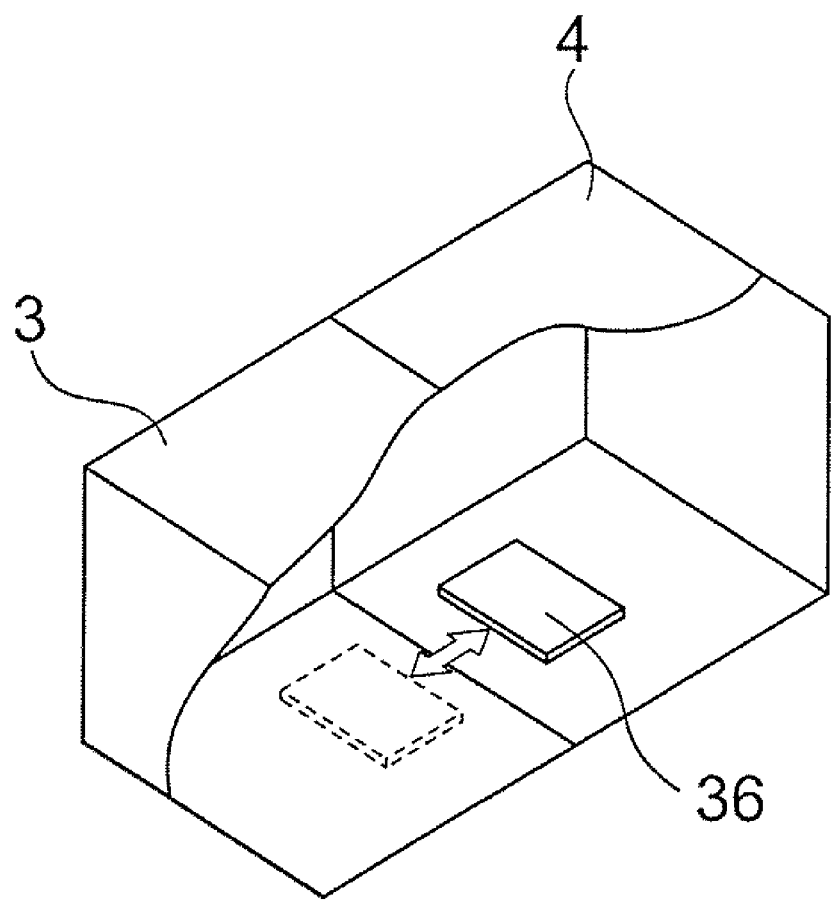
FIG. 20 is a schematic perspective view showing the inside of a contact module and eject module in a third embodiment of the present invention.
Figure 21:
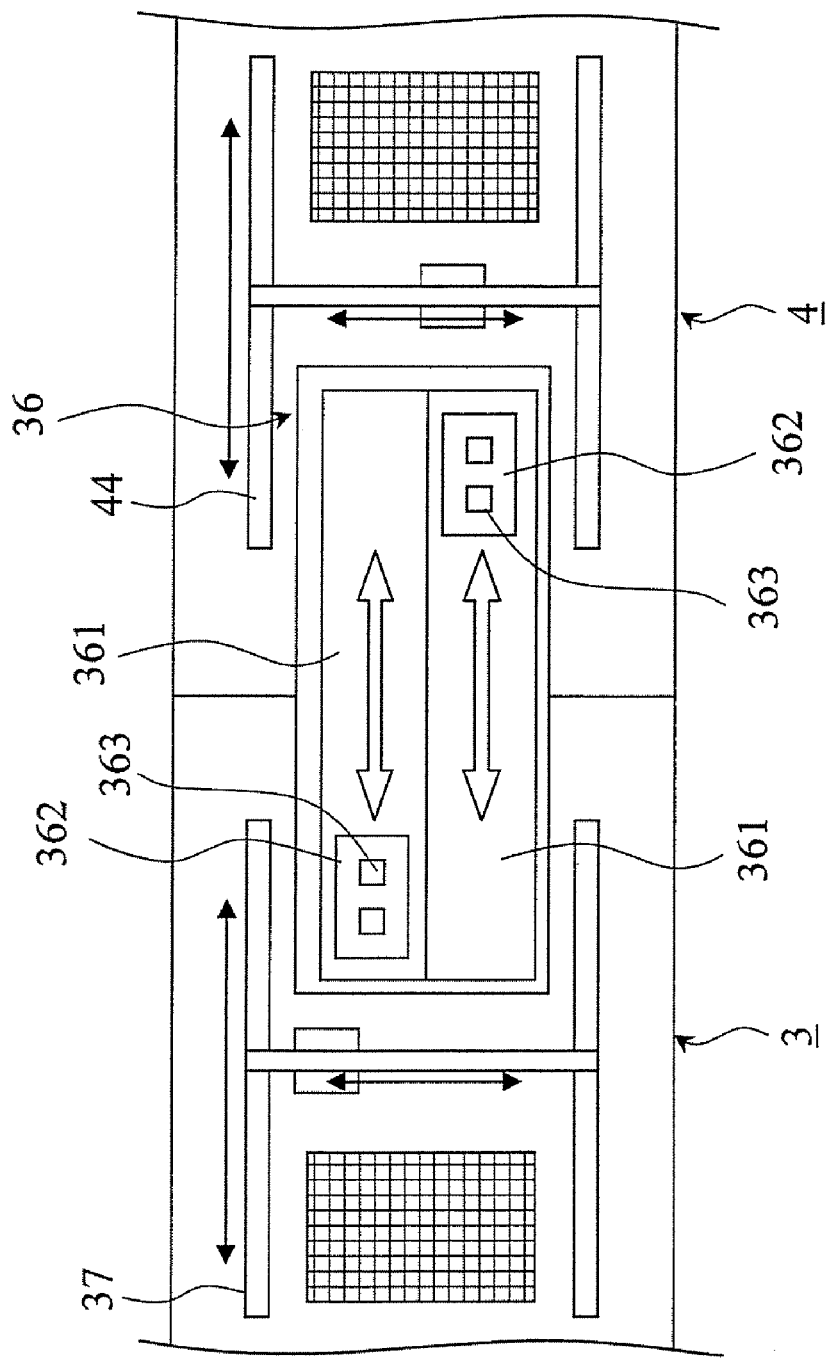
FIG. 21 is a plan view showing the inside of the contact module and eject module shown in FIG. 20.
Figure 22:
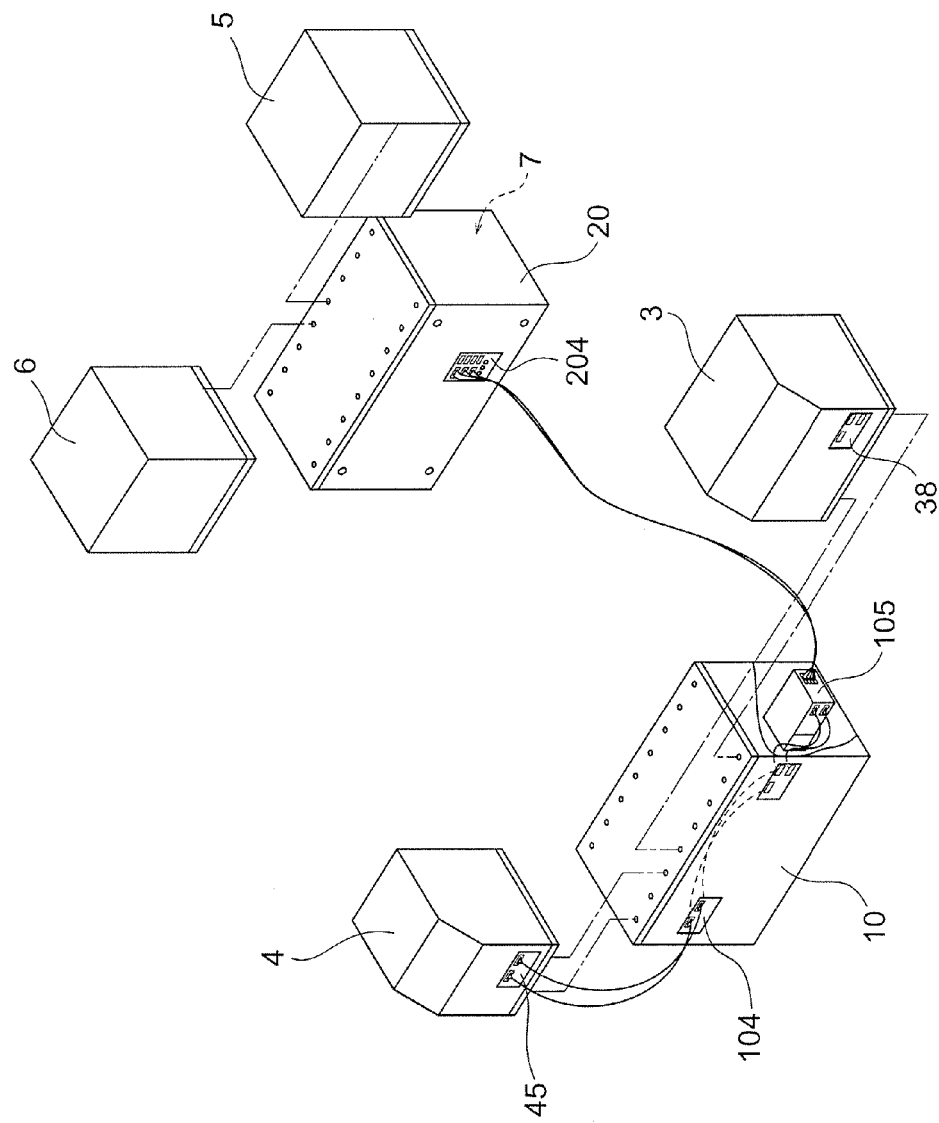
FIG. 22 is a disassembled perspective view showing electrical wiring etc. according to a handler in the second embodiment of the present invention.

FIG. 20 is a schematic perspective view showing the inside of a contact module and eject module in a third embodiment of the present invention, while FIG. 21 is a plan view of the inside of the contact module and eject module shown in FIG. 22.

Next, a third embodiment of the present invention not using test trays, but transferring the DUTs themselves between the modules will be explained. In the third embodiment of the present invention, as shown in FIG. 20 and FIG. 21, for example, a shuttle unit 36 is provided to bridge the contact module 3 and eject module 4. XYZ conveyor apparatuses 37, 44 are provided at its two sides.

The shuttle unit 36 has a base 361 able to move reciprocatively between the modules 3, 4 and shuttles 362 provided attachably/detachably on the base 36. The base 361, for example, is comprised of a belt conveyor, air cylinder, ball-screw mechanism, etc. Further, this base 361 is provided with connection ports for individually supplying the shuttles 362 with electric power, drive power, etc. and a bus line to which I/O controllers of the shuttles 362 are connected. The shuttles 362 are formed with pluralities of pockets 362 for holding the DUTs (in the example shown in FIG. 21, four). The shuttles 362 are positioned with respect to the base 361 using guide pins etc.

Further, the DUTs finished by tested at the contact module 3 are moved by the XYZ conveyor apparatus 37 to a shuttle 362, then the base 361 is moved to the eject module 4, and the XYZ conveyor apparatus 44 moves the DUTs from the shuttle 36 to the unsoak position, whereby the DUTs are transferred between the modules 3, 4.

In the present embodiment, in the shuttle unit 36, the shuttle 362 is modularized. It is therefore possible to switch to another type of shuttle with a different number of pockets 363 or increase the number of the shuttles 362 themselves.

Note that the shuttle unit 36 of the above configuration is not limited to being provided between the contact module 3 and eject module 4 and may also be provided between the loader module 5 and contact module 3 and between the eject module 4 and unloader module 6.

As another method for transfer of DUTs themselves between modules, it is also possible not to go through a shuttle unit 36, but to make the contact module 3 side XYZ conveyor apparatus 37 move the DUTs to a predetermined position and have the DUTs received by the eject module 4 side XYZ conveyor apparatus 44.

Figure 23:
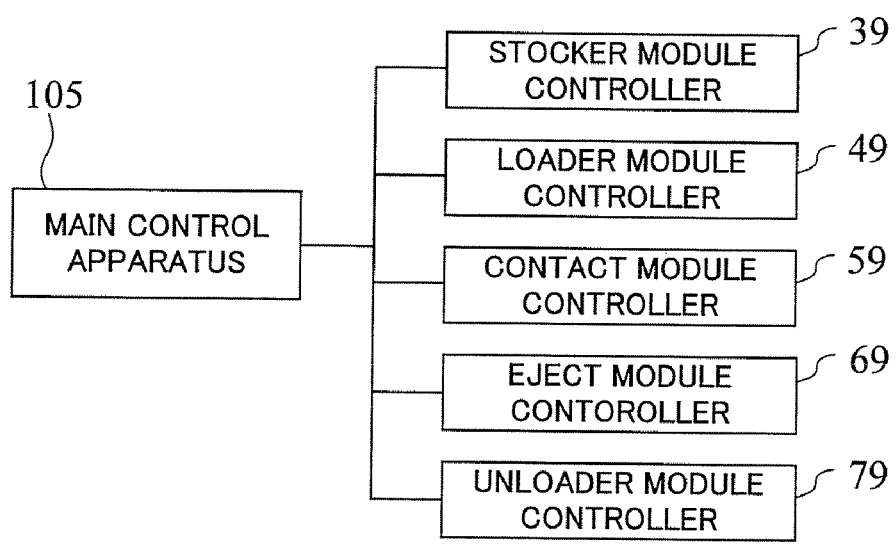
FIG. 23 is a block diagram showing the overall configuration of a control system of a handler according to the second embodiment of the present invention.

FIG. 22 is a disassembled perspective view showing the electrical wiring etc. of the handler according to the second embodiment of the present invention, while FIG. 23 is a block diagram of the overall configuration of the control system of the handler according to the second embodiment of the present invention.

As shown in FIG. 22, the contact module 3 and eject module 4 are provided with connection panels 38, 45. Further, the first main frame 10 is provided with a main connection panel 104. Further, the connection panels 38, 45 and the main connection panel 104 are connected by power cables, I/O cables, and air pipes, whereby the modules 3, 4 are supplied with power or air.

Similarly, while not particularly shown, the loader module 5, unloader module 6, and stocker module 7 are also provided with connection panels. Further, the second main frame 20 is also provided with the main connection panel 204. Further, the connection panels and main connection panel are connected by the power cables, I/O cables, and air pipes whereby the modules 5 to 7 are supplied with power or air.

As shown in FIG. 23, the modules 3 to 7 have controllers 39 to 79 for controlling the respective modules 3 to 7. The controllers 39 to 79 are connected through the connection panels and I/O cables to the main control apparatus 105 (central managing means). The main control apparatus 105 centrally manages the controllers 39 to 79. The main control apparatus 105, as shown in FIG. 22, is provided inside the first main frame 10.

The main control apparatus 105 has software for controlling the operations of the modules. By reading out ID data identifying the modules, it becomes possible to apply software corresponding to the individual ID data. Due to this, it becomes possible to immediately apply and utilize this to the formation of the system configuration of electronic device test apparatus for the DUTs.

Note that the embodiments explained above were described for facilitating understanding of the present invention and were not described for limiting the present invention. Therefore, the elements disclosed in the above embodiments include all design modifications and equivalents falling under the technical scope of the present invention. For example, when a tray which gives/receives the electronic device held to/from outside is identical with the test tray 91 used inside, the stoker module 24 is detached and exchanged for a carrying-in/out module which directly gives and receives the test tray 91 to/from outside. Also when an outside transfer system is exchanged for a system by using a mobile cart (for example, a monorail type, railway type or non-railway type (AGV)), the stocker unit 24 is detached and only exchanged for a carrying-in/out module which gives/receives the test tray 91 to/from the mobile cart. On the other hand, if desiring to return to the carrying-in/out by some workers, it is rapidly able to respond to the changing of the outside transfer by exchanging for the former stocker unit 24 only. Therefore the now existing apparatus are effectively used, also the obsolescence of the apparatus is prevented so that there is a merit of a significant decrease of the equipment cost. Also when a plural apparatus are operated, it is able to exchange for the module of different specifications at the point of production at any time. Whereby, the system configuration of the whole apparatus is organized so that its throughput is optimized. Especially when the variety of the electronic device which is mass-produced (for example memory device) is changed, it is improved the throughput by exchanging of the modules and restructuring the whole apparatus. Also when the apparatus breaks down, it is able to restart in a short time by exchanging the broken module for a module of same specification or by exchanging alternative module of different specification. On the other hand, the broken module is repaired as needed.

The invention claimed is:

1. A method of configuring an electronic device handling apparatus for bringing DUTs into electrical contact with contacts of a test head, the method comprising:
   modularizing a handling unit and a test unit forming the apparatus so as to enable exchange, add or reconfigure of the handling unit and the test unit; and
   selecting the handling unit having a corresponding throughput from among a plurality of handling units and the test unit having the corresponding number of simultaneous measurements from among a plurality of test units, on the basis of a maximum number of measurable pins of a tester, a number of terminals of the DUTs, and a test time of the DUTs, wherein
   the handling unit comprises a stocker unit, a loader unit and an unloader unit, and wherein
   the stocker unit comprises:
      a first stocker configured to store customer trays on which a plurality of pre-test DUTs are held;
      a second stocker configured to store customer trays on which a plurality of tested DUTs are held; and
      a tray conveyor configured to move a customer tray to the loader unit or the unloader unit,
   the loader unit has a first transfer device configured to transfer the pre-test DUTs from the customer tray to a test tray and move the test tray to the test unit,
   the unloader unit receives the test tray from the test unit and has a second transfer device configured to transfer the tested DUTs from the test tray to the customer tray, and
   the test unit receives the test tray from the handling unit and brings the DUTs into electrical contact with the contacts while the DUTs are held on the test tray, wherein
   the plurality of handling units differing in operating speed of the first transfer device and/or the number of the DUTs which are simultaneously held by the first transfer device.

2. The method of configuring an electronic device handling apparatus as set forth in claim 1, wherein
   the plurality of handling units differ in operating speed of the second transfer device and/or the number of the DUTs which are simultaneously held by the second transfer device.

3. The method of configuring an electronic device handling apparatus as set forth in claim 1, wherein
   the test unit has a plurality of pushers configured to push the DUTs against the contacts of the test head while the DUTs are held on the test tray, wherein
   the plurality of test units differ in the number of pushers.

4. The method of configuring an electronic device handling apparatus as set forth in claim 1, wherein
   the selecting further comprises: selecting the test unit having a corresponding test temperature from among the plurality of test units, wherein
   the test unit has a cooling device and/or a heating device configured to make the DUTs the target temperature while the DUTs are held on the test tray, wherein
   the plurality of test units comprise:
      a first test unit having only the cooling device between the cooling device and the heating device;
      a second test unit having only the heating device between the cooling device and the heating device: and/or
      a third test unit having both the cooling device and the heating device.

5. A method of configuring an electronic device handling apparatus for bringing DUTs into electrical contact with contacts of a test head, the method comprising:
   modularizing a handling unit and a test unit forming the apparatus so as to enable exchange, add or reconfigure a handling unit and a test unit forming the apparatus; and
   selecting the handling unit having a corresponding throughput from among a plurality of handling units and the test unit having the corresponding number of simultaneous measurements from among a plurality of test units, on the basis of a maximum number of measurable pins of a tester, a number of terminals of the DUTs, and a test time of the DUTs, wherein
   the handling unit comprises a stocker unit, a loader unit and an unloader unit, and wherein
   the stocker unit comprises:
      a first stocker configured to store customer trays on which a plurality of pre-test DUTs are held;
      a second stocker configured to store customer trays on which a plurality of tested DUTs are held; and
      a tray conveyor configured to move a customer tray to the loader unit or the unloader unit,
   the loader unit has a first transfer device configured to transfer the pre-test DUTs from the customer tray to a test tray and move the test tray to the test unit,
   the unloader unit receives the test tray from the test unit and has a second transfer device configured to transfer the tested DUTs from the test tray to the customer tray, and
   the test unit receives the test tray from the handling unit and brings the DUTs into electrical contact with the contacts while the DUTs are held on the test tray, wherein
   the plurality of handling units differ in an operating speed of the second transfer device and/or the number of the DUTs which are simultaneously held by the second transfer device.

6. The method of configuring an electronic device handling apparatus as set forth in claim 5, wherein
   the test unit has a plurality of pushers configured to push the DUTs against the contacts of the test head while the DUTs are held on the test tray, wherein
   the plurality of test units differ in the number of pushers.

7. The method of configuring an electronic device handling apparatus as set forth in claim 5, wherein
   the selecting further includes: selecting the test unit having a corresponding test temperature from among a plurality of test units, wherein
   the test unit has a cooling device and/or a heating device configured to make the DUTs the target temperature while the DUTs are held on the test tray, wherein
   the plurality of test units comprise:
      a first test unit having only the cooling device between the cooling device and the heating device;
      a second test unit having only the heating device between the cooling device and the heating device: and/or
      a third test unit having both the cooling device and the heating device.

* * * * *